United States Patent [19]

Sundet

[11] Patent Number: 4,630,230

[45] Date of Patent: Dec. 16, 1986

[54] SOLID STATE STORAGE DEVICE

[75] Inventor: James W. Sundet, Chippewa Falls, Wis.

[73] Assignee: Cray Research, Inc., Minneapolis, Minn.

[21] Appl. No.: 488,114

[22] Filed: Apr. 25, 1983

[51] Int. Cl.$^4$ .............................................. G06F 12/00
[52] U.S. Cl. ..................................... 364/900; 365/230
[58] Field of Search ... 364/200 MS File, 900 MS File; 365/230

[56] References Cited

U.S. PATENT DOCUMENTS

| | | | |
|---|---|---|---|
| 4,051,551 | 9/1977 | Lawrie et al. | 364/200 |
| 4,112,489 | 9/1978 | Wood | 364/200 |
| 4,149,242 | 4/1979 | Pirz | 364/200 |
| 4,187,539 | 2/1980 | Eaton | 364/200 |
| 4,280,176 | 7/1981 | Tan | 364/200 |
| 4,293,941 | 10/1981 | Muraoker et al. | 364/200 |
| 4,435,792 | 3/1984 | Bechtolsheim | 365/230 |
| 4,442,503 | 4/1984 | Schutt et al. | 364/900 |
| 4,489,381 | 12/1984 | Lavallee | 364/200 |
| 4,513,372 | 4/1985 | Ziegler et al. | 364/200 |
| 4,562,532 | 12/1985 | Nishizawa et al. | 364/200 |
| 4,571,676 | 2/1986 | Mantellina et al. | 364/200 |

Primary Examiner—James D. Thomas
Assistant Examiner—Thomas Lee
Attorney, Agent, or Firm—Merchant, Gould, Smith, Edell, Welter Schmidt

[57] ABSTRACT

A solid state storage device is disclosed. The storage sections of the device are divided into two groups, with each group including at least one, and as many as four storage sections. A port is provided for delivering words to and receiving words from the sections. A data path between the port and the device is two words wide, with one word received from or delivered to each group. Each section includes a word storage register, with the registers of different sections in the same group being connected in a series fashion to provide a one word data path between the storage sections. Words stored or retrieved from a section are passed through its respective register. In a write operation, words to be stored are transmitted serially from register to register and captured by all sections simultaneously on the same clock cycle. Addressing means within each section then routes the word to the appropriate memory circuit within the section. In a read operation each section loads its register simultaneously, after which the data words are transmitted in a serial fashion from register to register out of the memory to the port. The memory circuits within each section are organized into a plurality of banks, each of which may be addressed independently of one another, so that a section may capture at least one word per clock cycle. A further circuit is provided to reverse the order of words received from the port during a write operation to cause the words to be in proper order when read from the memory.

10 Claims, 28 Drawing Figures

GROUP 0

| SECTION 0 | SECTION 1 | SECTION 2 |
|---|---|---|
| BK 0 WORD 6 | BK 0 WORD 4 | BK 0 WORD 2 |
| BK 1 WORD 14 | BK 1 WORD 12 | BK 1 WORD 10 |
| BK 2 WORD 22 | BK 2 WORD 20 | BK 2 WORD 18 |
| BK 3 WORD 30 | BK 3 WORD 28 | BK 3 WORD 26 |
| BK 4 WORD 38 | BK 4 WORD 36 | BK 4 WORD 34 |
| BK 5 WORD 46 | BK 5 WORD 44 | BK 5 WORD 42 |
| BK 6 WORD 54 | BK 6 WORD 52 | BK 6 WORD 50 |
| BK 7 WORD 62 | BK 7 WORD 60 | BK 7 WORD 58 |

| SECTION 3 ||
|---|---|
| BK 0 WORD 0 | BK 4 WORD 32 |
| BK 1 WORD 8 | BK 5 WORD 40 |
| BK 2 WORD 16 | BK 6 WORD 48 |
| BK 3 WORD 24 | BK 7 WORD 56 |

| SECTION 0 | SECTION 1 | SECTION 2 |
|---|---|---|
| BK 0 WORD 7 | BK 0 WORD 5 | BK 0 WORD 3 |
| BK 1 WORD 15 | BK 1 WORD 13 | BK 1 WORD 11 |
| BK 2 WORD 23 | BK 2 WORD 21 | BK 2 WORD 19 |
| BK 3 WORD 31 | BK 3 WORD 29 | BK 3 WORD 27 |
| BK 4 WORD 39 | BK 4 WORD 37 | BK 4 WORD 35 |
| BK 5 WORD 47 | BK 5 WORD 45 | BK 5 WORD 43 |
| BK 6 WORD 55 | BK 6 WORD 53 | BK 6 WORD 51 |
| BK 7 WORD 63 | BK 7 WORD 61 | BK 7 WORD 59 |

| SECTION 3 ||
|---|---|
| BK 0 WORD 1 | BK 4 WORD 33 |
| BK 1 WORD 9 | BK 5 WORD 41 |
| BK 2 WORD 17 | BK 6 WORD 46 |
| BK 3 WORD 25 | BK 7 WORD 57 |

GROUP 1

FIG. 4

GROUP 0

| SECTION 0 | | | SECTION 1 | | |
|---|---|---|---|---|---|
| ADR. 0 | BK 0 | WORD 2 | ADR. 0 | BK 0 | WORD 0 |
| | BK 1 | WORD 6 | | BK 1 | WORD 4 |
| | BK 2 | WORD 10 | | BK 2 | WORD 8 |
| | BK 3 | WORD 14 | | BK 3 | WORD 12 |
| | BK 4 | WORD 18 | | BK 4 | WORD 16 |
| | BK 5 | WORD 22 | | BK 5 | WORD 20 |
| | BK 6 | WORD 26 | | BK 6 | WORD 24 |
| | BK 7 | WORD 30 | | BK 7 | WORD 28 |
| ADR. 1 | BK 0 | WORD 34 | ADR. 1 | BK 0 | WORD 32 |
| | BK 1 | WORD 38 | | BK 1 | WORD 36 |
| | BK 2 | WORD 42 | | BK 2 | WORD 40 |
| | BK 3 | WORD 46 | | BK 3 | WORD 44 |
| | BK 4 | WORD 50 | | BK 4 | WORD 48 |
| | BK 5 | WORD 54 | | BK 5 | WORD 52 |
| | BK 6 | WORD 58 | | BK 6 | WORD 54 |
| | BK 7 | WORD 62 | | BK 7 | WORD 60 |

| SECTION 0 | | | SECTION 1 | | |
|---|---|---|---|---|---|
| ADR. 0 | BK 0 | WORD 3 | ADR. 0 | BK 0 | WORD 1 |
| | BK 1 | WORD 7 | | BK 1 | WORD 5 |
| | BK 2 | WORD 11 | | BK 2 | WORD 9 |
| | BK 3 | WORD 15 | | BK 3 | WORD 13 |
| | BK 4 | WORD 19 | | BK 4 | WORD 17 |
| | BK 5 | WORD 23 | | BK 5 | WORD 21 |
| | BK 6 | WORD 27 | | BK 6 | WORD 25 |
| | BK 7 | WORD 31 | | BK 7 | WORD 29 |
| ADR. 1 | BK 0 | WORD 35 | ADR. 1 | BK 0 | WORD 33 |
| | BK 1 | WORD 39 | | BK 1 | WORD 37 |
| | BK 2 | WORD 43 | | BK 2 | WORD 41 |
| | BK 3 | WORD 47 | | BK 3 | WORD 45 |
| | BK 4 | WORD 51 | | BK 4 | WORD 49 |
| | BK 5 | WORD 55 | | BK 5 | WORD 53 |
| | BK 6 | WORD 59 | | BK 6 | WORD 57 |
| | BK 7 | WORD 63 | | BK 7 | WORD 61 |

GROUP 1

FIG. 5

| GROUP 0 | GROUP 1 |
|---|---|
| SECTION 0 | SECTION 0 |
| ADR. 0 BK 0 WORD 0<br>BK 1 WORD 2<br>BK 2 WORD 4<br>BK 3 WORD 6<br>BK 4 WORD 8<br>BK 5 WORD 10<br>BK 6 WORD 12<br>BK 7 WORD 14<br>ADR. 1 BK 0 WORD 16<br>BK 1 WORD 18<br>BK 2 WORD 20<br>BK 3 WORD 22<br>BK 4 WORD 24<br>BK 5 WORD 26<br>BK 6 WORD 28<br>BK 7 WORD 30<br>ADR. 2 BK 0 WORD 32<br>BK 1 WORD 34<br>BK 2 WORD 36<br>BK 3 WORD 38<br>BK 4 WORD 40<br>BK 5 WORD 42<br>BK 6 WORD 44<br>BK 7 WORD 46<br>ADR. 3 BK 0 WORD 48<br>BK 1 WORD 50<br>BK 2 WORD 52<br>BK 3 WORD 54<br>BK 4 WORD 56<br>BK 5 WORD 58<br>BK 6 WORD 60<br>BK 7 WORD 62 | ADR. 0 BK 0 WORD 1<br>BK 1 WORD 3<br>BK 2 WORD 5<br>BK 3 WORD 7<br>BK 4 WORD 9<br>BK 5 WORD 11<br>BK 6 WORD 13<br>BK 7 WORD 15<br>ADR. 1 BK 0 WORD 17<br>BK 1 WORD 19<br>BK 2 WORD 21<br>BK 3 WORD 23<br>BK 4 WORD 25<br>BK 5 WORD 27<br>BK 6 WORD 29<br>BK 7 WORD 31<br>ADR. 2 BK 0 WORD 33<br>BK 1 WORD 35<br>BK 2 WORD 37<br>BK 3 WORD 39<br>BK 4 WORD 41<br>BK 5 WORD 43<br>BK 6 WORD 45<br>BK 7 WORD 47<br>ADR. 3 BK 0 WORD 49<br>BK 1 WORD 51<br>BK 2 WORD 53<br>BK 3 WORD 55<br>BK 4 WORD 57<br>BK 5 WORD 59<br>BK 6 WORD 61<br>BK 7 WORD 63 |

FIG. 6

|  |  | BIT 0 | 1 | 2 | 3 | 4 | 5 | 6 | 7 |
|---|---|---|---|---|---|---|---|---|---|
| | ROW 0 | N00 | N01 | N02 | N03 | N04 | N05 | N06 | N07 |
| | 1 | N10 | N11 | N12 | N13 | N14 | N15 | N16 | N17 |
| S | 2 | N20 | N21 | N22 | N23 | N24 | N25 | N26 | N27 |
| I | 3 | N30 | N31 | N32 | N33 | N34 | N35 | N36 | N37 |
| D | 4 | N40 | N41 | N42 | N43 | N44 | N45 | N46 | N47 |
| E | | | | | | | | | |
| A | 5 | N50 | N51 | N52 | N53 | N54 | N55 | N56 | N57 |
| | 6 | N60 | N61 | N62 | N63 | N64 | N65 | N66 | N67 |
| | 7 | N70 | N71 | N72 | N73 | N74 | N75 | N76 | N77 |

|  |  | BIT 0 | 1 | 2 | 3 | 4 | 5 | 6 | 7 |
|---|---|---|---|---|---|---|---|---|---|
| | ROW 10 | N100 | N101 | N102 | N103 | N104 | N105 | N106 | N107 |
| | 11 | N110 | N111 | N112 | N113 | N114 | N115 | N116 | N117 |
| S | 12 | N120 | N121 | N122 | N123 | N124 | N125 | N126 | N127 |
| I | 13 | N130 | N131 | N132 | N133 | N134 | N135 | N136 | N137 |
| D | 14 | N140 | N141 | N142 | N143 | N144 | N145 | N146 | N147 |
| E | | | | | | | | | |
| M | 15 | N150 | N151 | N152 | N153 | N154 | N155 | N156 | N157 |
| | 16 | N160 | N161 | N162 | N163 | N164 | N165 | N166 | N167 |
| | 17 | N170 | N171 | N172 | N173 | N174 | N175 | N176 | N177 |

FIG. 14

SOLID STATE STORAGE DEVICE

BACKGROUND OF THE INVENTION

The present invention pertains to the field of solid state storage devices, and more particularly to the field of add-on high speed solid state storage devices.

In recent years advancements in integrated circuit technology have enabled development of memory chips of greatly increased capacity, reducing the cost per unit storage for solid state storage devices. Pursuant to both the cost reductions and the greatly reduced space requirements, solid state storage devices have become increasingly popular as an alternative or supplement to magnetic storage devices such as tapes or disk drives, particularly in I/O bound processing systems.

While such "solid state disk" storage devices have been provided in the prior art, certain design barriers have limited their capacity and speed. For example, as capacity has been increased worst case propagation delay has become quite a significant speed limiting design parameter, notwithstanding the significant increases in packaging density that have been accomplished through advanced cooling techniques. In addition, due to physical limitations on the number of interconnection pins which can be provided and constraints on the number and length of interconnection wires, the distribution of addressing controls and data also becomes ever more problematic as capacity is sought to be increased. Still other significant problems are presented in the case where dynamic RAM storage devices are utilized which require periodic refresh characterized by sudden and high current supply demands which, if not dealt with adequately, will result in unacceptable levels of system noise.

SUMMARY OF THE INVENTION

The present memory system avoids the above-described difficulties by providing a solid state storage device utilizing an organization which minimizes data fan in and fan out and addressing fan out requirements. The storage section is organized into two groups, each group including a plurality of sections. Each section provided includes eight banks, paired in modules. The addressing and data is provided to the two groups identically so that each group receives one word each clock cycle. A pipeline technique of data distribution is employed, wherein data words are supplied to a first section in each group and transferred section to section on each succeeding block cycle until all sections have a word and may be written into storage simultaneously. In the case of a write operation, words are captured from the sections simultaneously and passed out of the memory section to section. Refresh operations are accomplished on a periodic basis and a plurality of power supplies are provided for the storage modules in order to distribute refresh current demand over time and between the power supplies, providing for a safe and speedy refresh operation.

BRIEF DESCRIPTION OF THE DRAWINGS

FIG. 4 illustrates the distribution of a 64 word block in a 32 million word configuration of the present memory system;

FIG. 5 illustrates the distribution of a 64 word block in a 16 million word configuration of the present memory system;

FIG. 6 illustrates the distribution of a 64 word block in an 8 million word configuration of the present memory system;

FIG. 14 is a bit location chart for a storage module of the present memory system;

DETAILED DESCRIPTION

Figure 1:
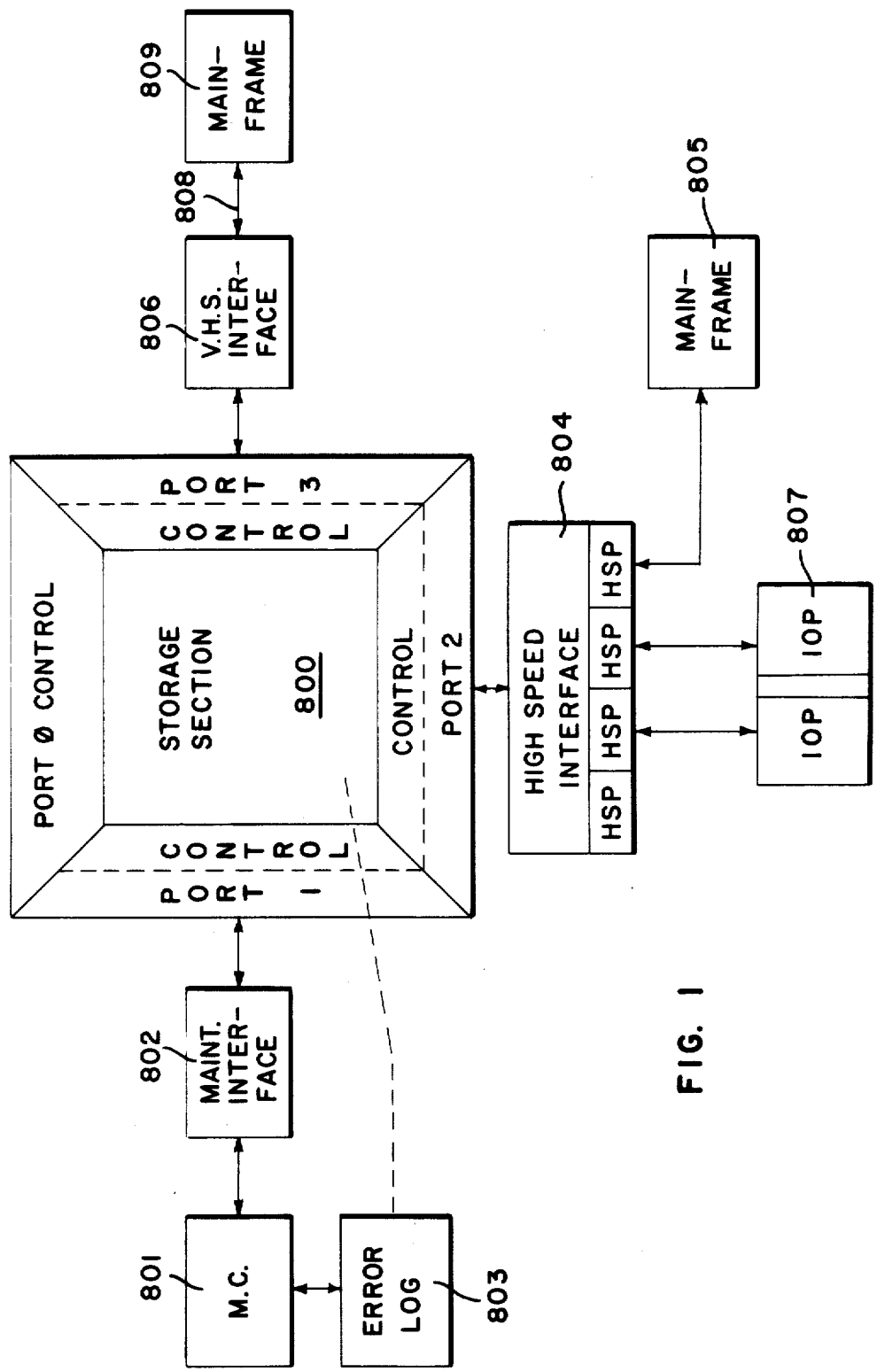
FIG. 1 illustrates the basic overall configuration of the present memory system.

FIG. 1 shows the basic overall configuration of the present memory system. A memory array or storage section 800 is provided to store data, and is provided with four ports, of which three are provided for connection to maintenance and user processors. Each of these ports provides an access or data path to the storage section 800 for access and control communication. Preferably, a port 1 is connected to an intelligent maintenance interface 802 that can interpret commands from a maintenance computer 801 and perform maintenance operations in the storage section 800 at memory clock speed. An error log 803 is connected to maintenance computer 801 and storage section 800. Error log 803 is for accumulating error information concerning port errors or storage errors and passing them to the maintenance computer 801, which may then log the error information for maintennce analysis.

The storage section 800 may be connected through a port 2 to a high speed interface 804, which provides four 100 megabyte/s data channel pairs, or high speed channels (HSP). As illustrated, one channel pair may be connected to a mainframe computer 805. Interface 804 may also be connected with one or more input-output processors 807 (IOP's), which provide interface to peripheral storage devices such as disk and tape drives. Port 3 may be connected to a very high speed interface 806, which can support the full transfer rate capability of the storage section 800. A 144 bit wide cable 808 may be utilized to connect interface 806 to a mainframe computer 809, preferably capable of commensurate transfer rates.

Figure 2:
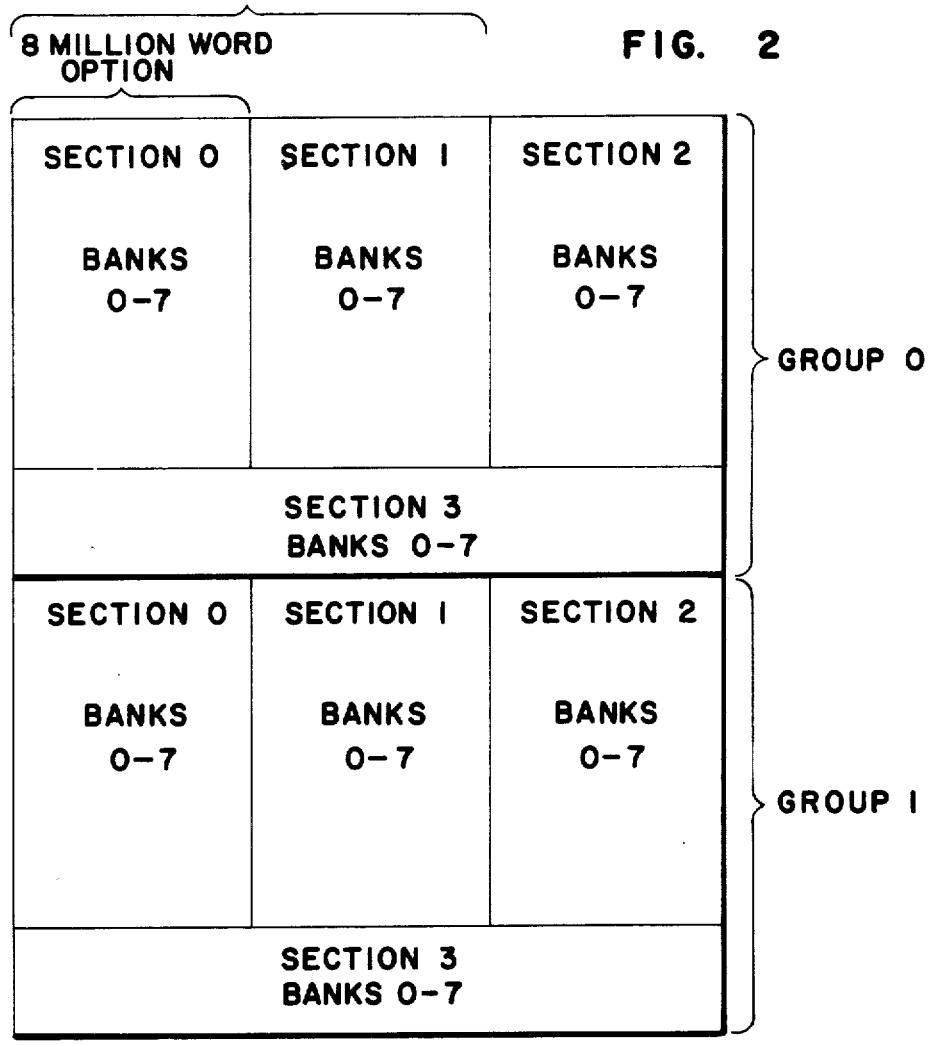
FIG. 2 illustrates the organization of the storage section of the present memory system.

As may be seen with reference to FIG. 2, the storage section 800 is organized into groups, sections and banks, with the number of sections provided depending on the memory size, which may vary. Each section includes 8 banks, 0 through 7. Physically, the storage section is supported in three vertical system chassis columns with group 0 occupying the upper half of the three columns and group 1 the lower half. Only two sections, one in each group, are utilized in an eight million word memory configuration. Two sections in each group are provided for a sixteen million word configuration and all four sections 0-3 are provided for each group in a thirty two million word configuration.

Figure 3:
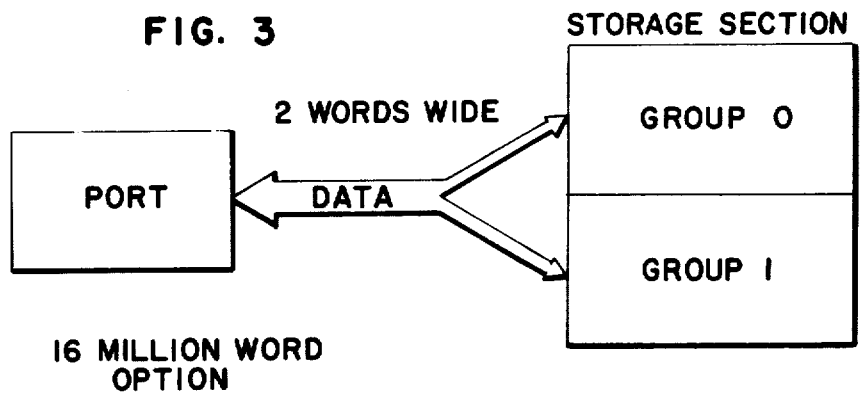
FIG. 3 illustrates the data path between a fan in circuit in the storage section of the present memory system.

Each group is used as a separate but parallel memory. As illustrated in FIG. 3, a port data path to and from the storage section 800 is two words wide in each direction. Each word is sixty-four data bits and eight check bits. Half the data path goes to group 0 and the other half goes to group 1.

The storage section 800 operates on a block transfer basis with 64 words per block, and in this respect it is similar to a disk storage unit which only stores complete sectors of data. All memory sizes have 524,288 addresses, with the number of words per address varying with the memory size. There are 64 words per address for the 32 million word memory, 32 words per address for the 16 million word memory and 16 words per address for the eight million word memory.

FIG. 4 illustrates how a 64 word block is distributed into one address location of a 32 million word configuration with respect to the order in whch they are input from a data port. The words are numbered decimally with word 0 being the first word received. Even and odd words are distributed between groups 0 and 1 on an alternating basis, beginning with word 0 in bank (BK) 0 of section 3, group 0 and word 1 in bank 0 of section 3, group 1. Following words are distributed on a cyclical basis in sections 2, 1 and 0, with the bank incrementing every cycle.

For a 16 million word configuration, two address locations are required with 32 words stored in each address location, as shown in FIG. 5. For an 8 million word configuration four address locations are required with 16 words per address location as shown in FIG. 6. It will be seen that in each of the above cases, two groups of memory are employed with each group including an equal number of sections.

The present memory system employs a "pipeline" method of data distribution to reduce data fan-out and fan-in complexity, and thereby avoid the need for excessive and impractical package pin-out and interconnection wiring. With this method, data is passed from section to section without actually storing the data until all sections see their designated data word. In the case of the 32 million word memory, 8 words are written simultaneously into storage; for a 16 million word configuration, 4 words, and for an 8 million word configuration, 2 words.

Figure 7:
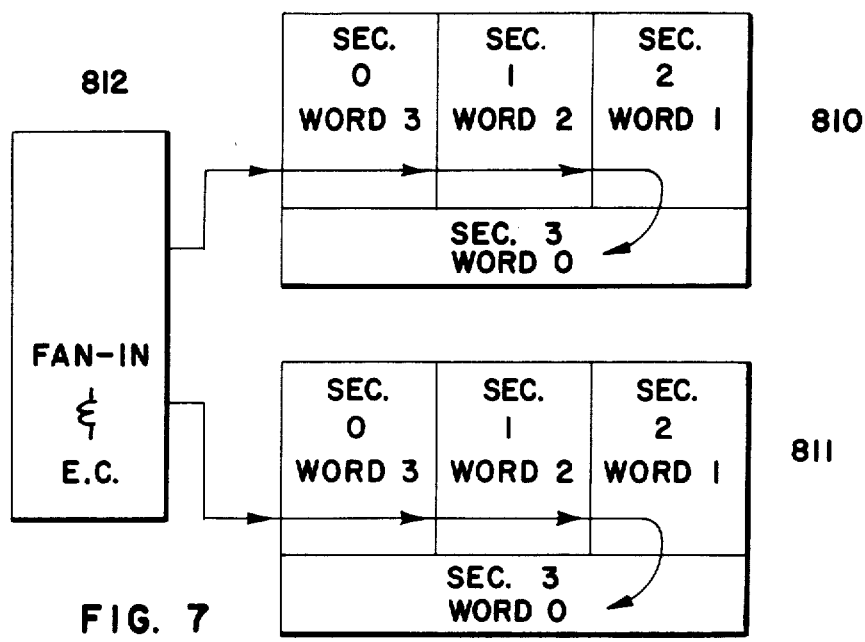
FIG. 7 illustrates the concept of the present system's write and read data flow.

FIG. 7 generally illustrates the concept of the present system's write data flow or passage into the 0 and 1 storage groups, 810 and 811, respectively, from a fan in and error correction (EC) circuit 812. For this 32 million word configuration, the first data word (0) for each group arrives and enters section 0. Then, the second word (1) enters section 0 and the first word passes over to section 1 and so on until the first data word reaches section 3. Then all eight words are written into memory simultaneously.

The read operation uses the same data flow technique, but in reverse, with all sections reading out their data at the same time, but only one section's data becoming available on the first and each succeeding clock period. With the smaller memory sizes, there are fewer sections per group and the write and read paths are shortened, but the principal of pipelining remains the same.

For a full sized storage section 800, i.e. 32 million words, a "memory cycle" comprises the transfer of 32 words from half the total number of banks. The first memory cycle uses all banks 0, 1, 2, and 3 in each section and the second memory cycle uses all banks 4, 5, 6 and 7.

Figure 8:
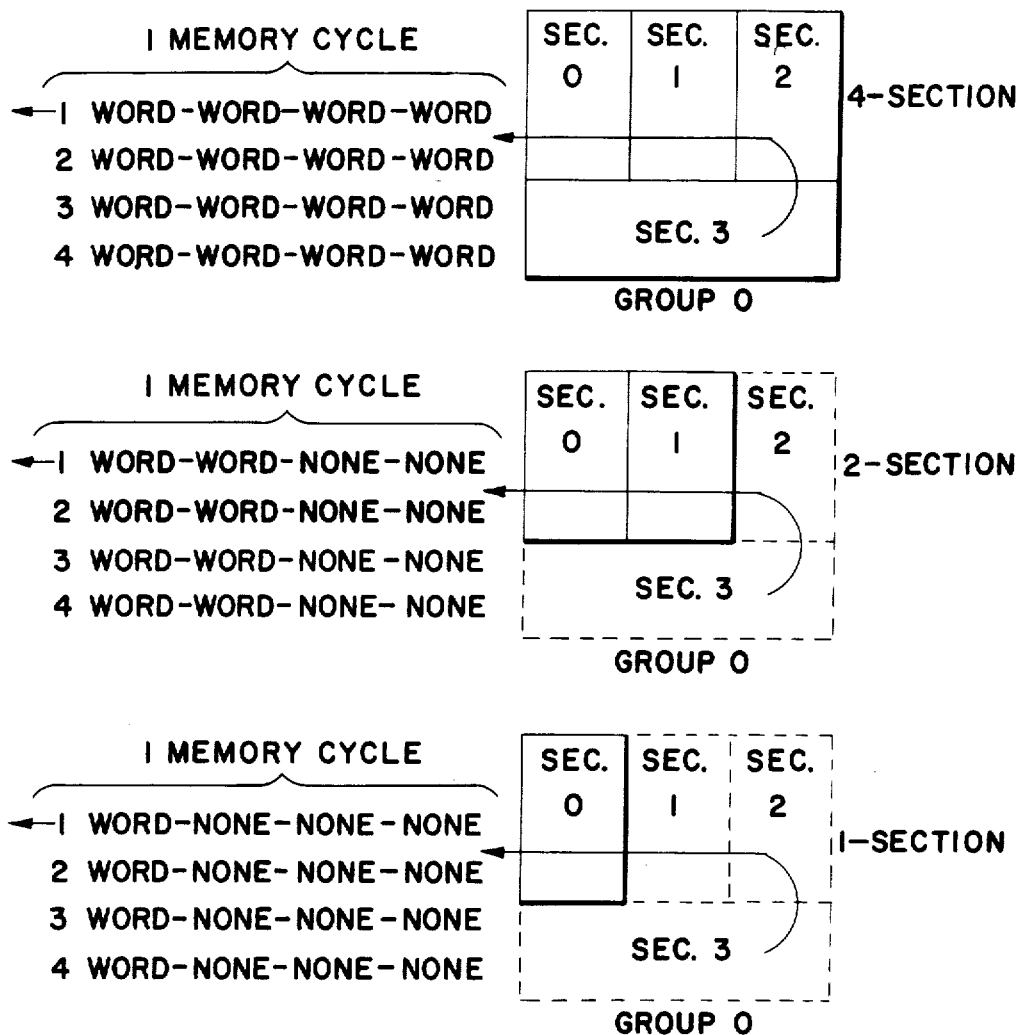
FIG. 8 illustrates the data transfer cycles for all configurations of the present memory system.

For the memory sizes with only one or two sections per group the same memory cycle time is required but fewer words are transferred in each memory cycle. Referring to FIG. 8 the words per memory cycle for 1, 2, or 4 section configurations are shown for one group. For eight million words, 8 words, 4 from each group, are transferred per memory cycle. The sixteen million word transfers 16 words per memory cycle. The control timing of the storage section 800 is based on how long it takes to access half the banks of a full size memory. Therefore, the control logic and timing is the same for all memory size options and only the transfer speed is changed for smaller memories. As the number of memory cycles needed to transfer a full 64 word block depends on the memory size, so too does the transfer rate. For a full sized memory 1.14 gigabytes per second may be transferred. For the 16 and 8 million word memories 568.9 and 284.4 megabytes per second transfer rates respectively, may be accomplished.

It will be seen that the pipeline distribution method results in a reversal of the data order when read back out of memory. More specifically, it will be seen that since for any given four word group the last word received is written into section 0, it will be the first word read out and thus the read out word sequence is the reverse of the write word sequence. To compensate for this reversal, the port interface alters the sequence of write words before delivery to the storage section 800. The manner of reversal depends on the memory size so the storage section 800 sends to each data ports' interface static signals which show how many sections are installed whereby an interface may generate the proper reversed sequence for the memory size.

Figure 9:
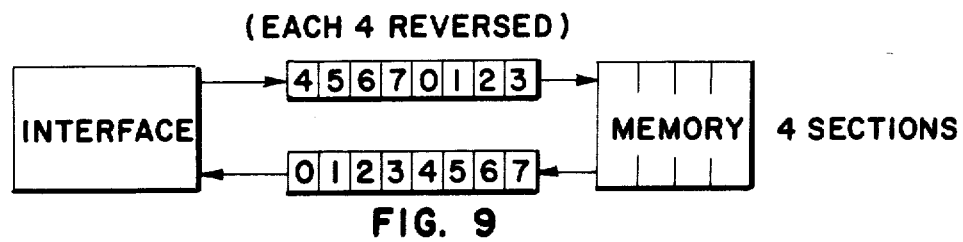
FIGS. 9, 10 and 11 illustrate the write work reversal for all configurations of the present memory systems.
Figure 10:
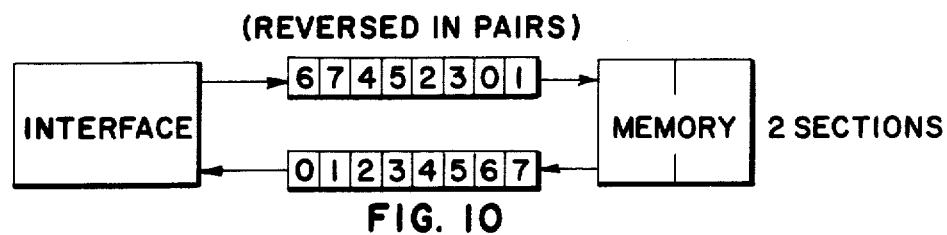
Figure 11:
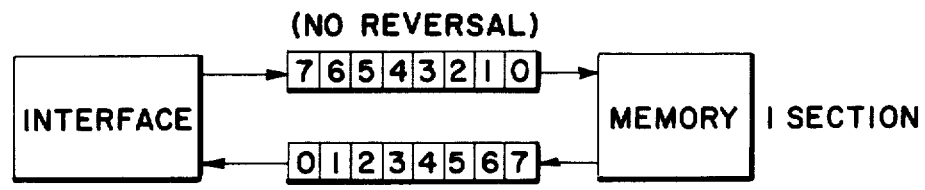

FIGS. 9, 10 and 11 illustrate the write word sequence reversals for a 4, 2 and 1 section memory configuration. For a 4 section full sized memory, the interface reverses the write word sequence in groups of four words. Thus, word 3 goes into section 3 (of group 0) and word 0 goes into section 0 (group 0). For a two section memory words are reversed in pairs, so that word 1 enters storage first, and word 0 goes in second. A one section memory does not need to reverse the word sequence since there is no pipelining, section to section.

Figure 12:
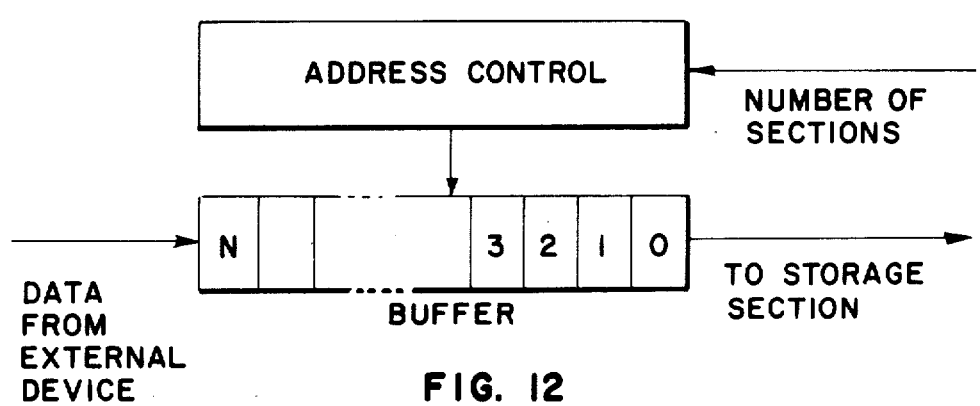
FIG. 12 is a functional block diagram of the reversal buffer for the present memory system.

Referring to FIG. 12, a reversal buffer for reversing word order is illustrated. The buffer may hold N words, preferably 32 or 64, which are received from an external device over a data path in normal order, i.e., 0, 1, 2, 3, etc ... The buffer may be selectively addressed at transfer rate speed. Thus, words may be read out in reverse order as addressed by an address control circuit responsive to a signal indicating the number of sections in the memory.

In the preferred embodiment, a 200 NS version of the 4164 dynamic RAM is utilized as the basic storage element of the storage section 800. This chip is a 65,536 by 1-bit dynamic ram with an access time of 200 nanoseconds. However, it will be understood that the 150 nanosecond version of this chip may also be utilized with slight variations in timing. Within these chips, all addressing is done by storage cell row and column selection. There are 256 rows and 256 columns in the chip's array of storage cells ($256 \times 256 = 65,536$). Each chip is provided with eight address inputs, which may be selectively loaded with row and column reference addresses, 256 possibilities for each. The intersection of a selected row and column is the selected one bit storage cell.

In the present memory system, each bank is capable of storing 524,288 data words with 64 bits per word. In addition, each bank provides storage for 8 check bits per word or 524,288 bytes, with 8 bits per byte. Thus, each bank requires 576 storage chips, and these are arranged in 9 groups, each including 64 chips. Each group of 64 chips is paired with another to provide a storage module, one of which is diagramatically illustrated in FIG. 13. The A side (left) is provided for a bank N and the M side (right) is provided for a bank N+4.

The storage chip array 850 includes 128 storage chips denoted in FIG. 8 as N0–N177 octal. The chips are arranged in blocks 830–845 with 8 chips per block. The blocks are arranged in pairs, for example 830 and 838, 831 and 839 and so on, with all chips in each block pair receiving a single data bit from the write data bus B0–B7.

In operation, one side of the module or array 850 is used during a read or write reference to either store 8 bits of data from the B0–B7 write data bus or to read 8 bits of data to the read data R0–R7 bus. For any given read or write operation the corresponding chip of each block and a corresponding cell in each chip is utilized. Thus, there is provided addressing logic capable of selecting any row of chips in the block pairs and any one cell within the selected chips. Referring to FIG. 14, which is a bit location chart, the designation of the chips in rows and columns may be seen. This is not to be confused with rows and columns of storage cells within each chip. There are eight rows per column or side (A and M), with each row including eight chips. For example, chip row 3 includes chips N30–N37. A particular data write operation may involve for example selecting a row of chips N20, N21, N22, N23, N24, N25, N26, N27 from the A side column and selecting a particular storage cell within chips N20-27 by row and column for receiving the respective data bits B0–B7.

To select a particular cell in the storage chips to receive the data bits B0 ∝ B7, row and column address signals A0–A8, a row address strobe, and a column address strobe are provided to each of the bank pairs. Each row address and column address is 9 bits wide and are provided over the same line with the row address being delivered first, followed later by the column address. Because certain combinations of new address strobe (RAS) and column address strobe (CAS) control enabling any given row of chips for a read or write operation, there is no need to selectively multiplex the cell row and column address, and thus a common bus for these addresses may be provided for all chips. The storage chip only uses 8 bits of address data for row or column addressing, with the ninth address bit provided for expansion. As will be seen, RAS is generated by decode logic 851, which receives chip select signals over a bus 852 from a central addressing control, as will be hereinafter explained in more detail. In operation, RAS and CAS are set high, the row address delivered, and then a selected RAS is set low to load the row address for cell selection into all chips in the selected row. Next, the column address is delivered and the CAS brought low to load the column address into all chips in the selected row. The selected RAS, and the CAS are then set high in sequence, and a write enable (WE) signal delivered to load. Although CAS and WE are provided to all chips on both sides, they are only acknowledged by those chips strobed by RAS in the foregoing sequence so that these signals do not need to be selectively supplied to the chip rows. A read operation proceeds in the same manner except that WE is left high whereby the data output pins are enabled for each chip in the selected row and column.

Figure 13:
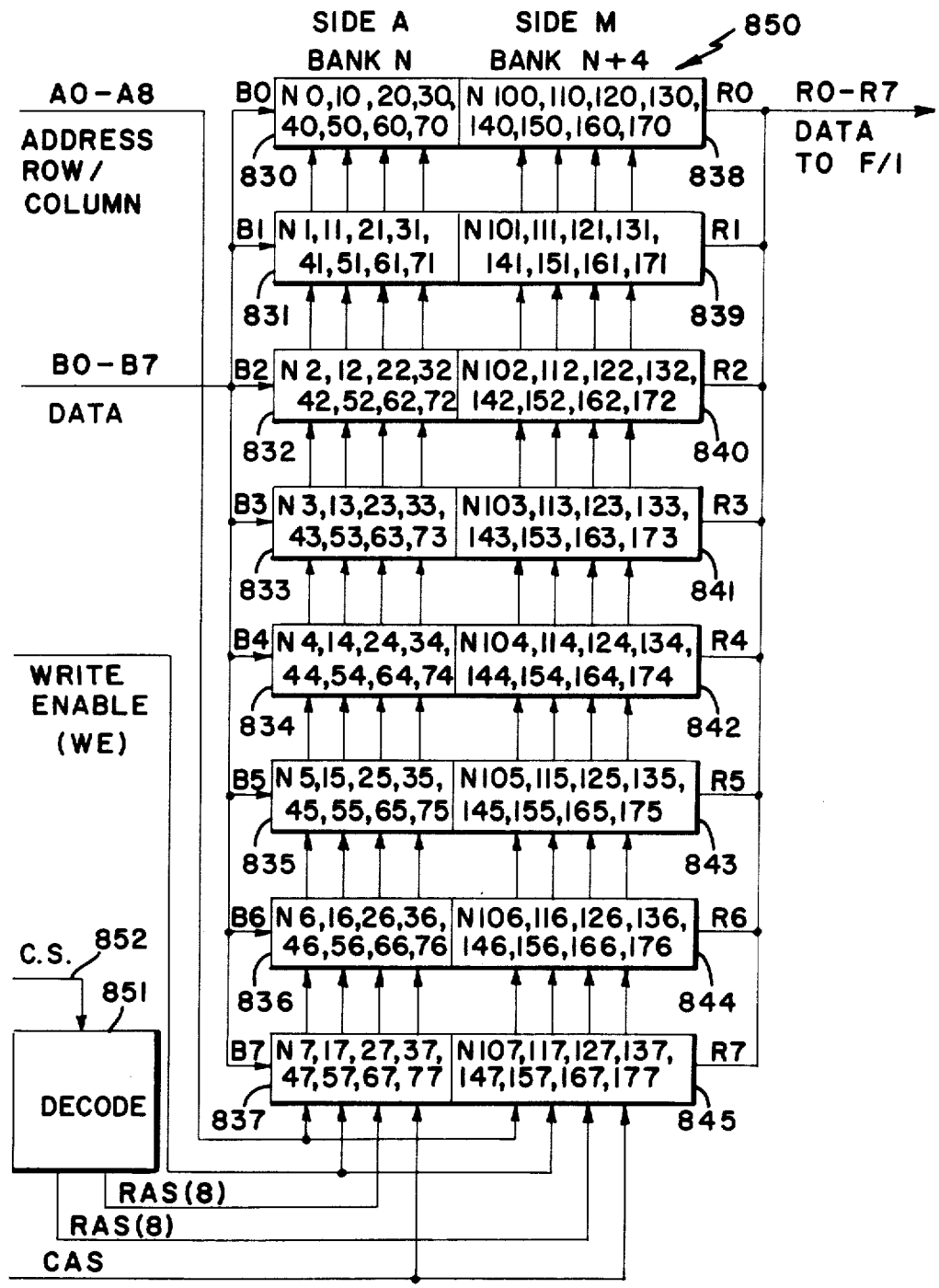
FIG. 13 is a functional block diagram of a storage module of the present memory system.
Figure 15:
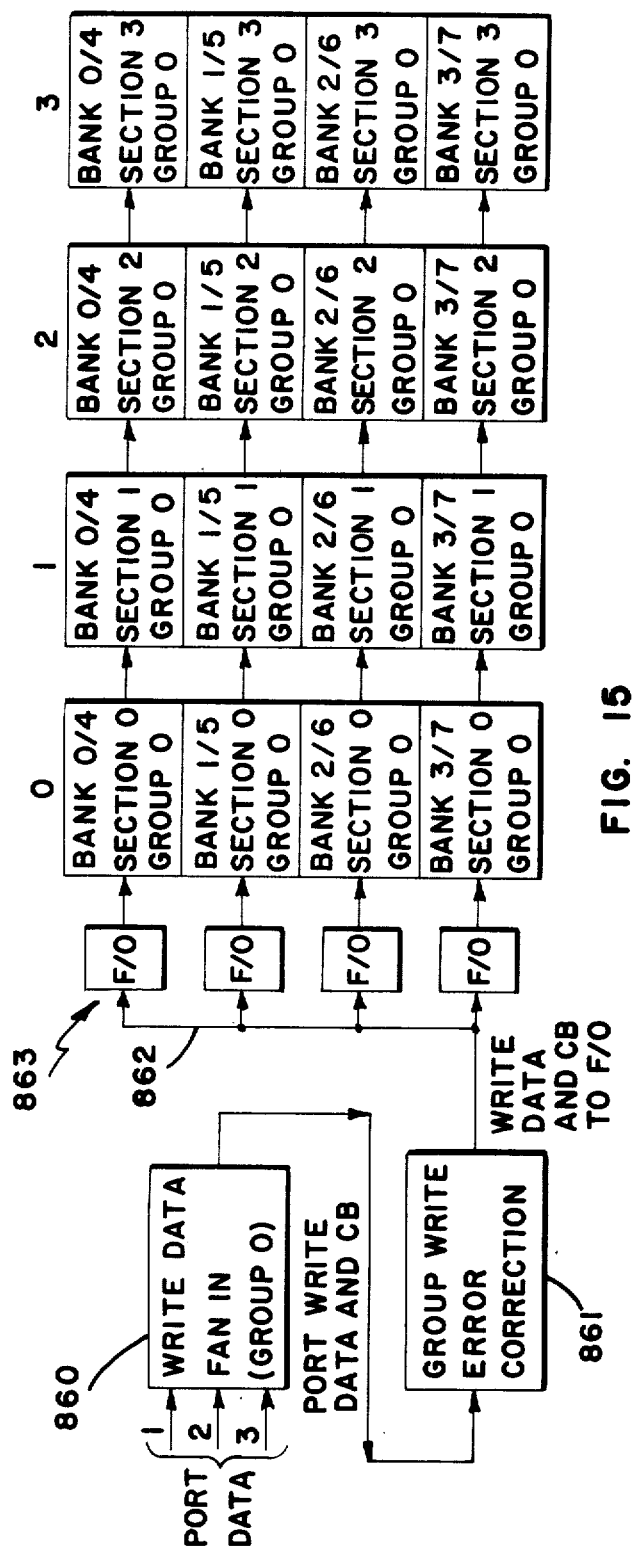
FIG. 15 is a functional block diagram of the write data fan out.

As hereinbefore mentioned, 9 modules or arrays 850 are utilized to provide 2 banks of memory storage capacity. Accordingly, each memory section includes 36 modules 850 for a total memory capacity per section of 4,194,304 words. As illustrated in FIG. 13, 8 bits of write data is distributed to each module 850. Accordingly, as illustrated in FIG. 15, a write data bus 862 is utilized to provide a full word of write data to fan-outs 863, which then fan the word out in eight bit segments to the different ones of the nine modules 850 for each bank pair. In the figure, words of data are received through one of the ports 1, 2 or 3 by write data fan-in 860. Write data fan-in 860 selects the desired port and fans in the 64 bits of write data and 8 bits of check bit data from the selected port to a group write error correction circuit 861, which performs error correction where appropriate, and delivers the data to bus 862.

Figure 16:
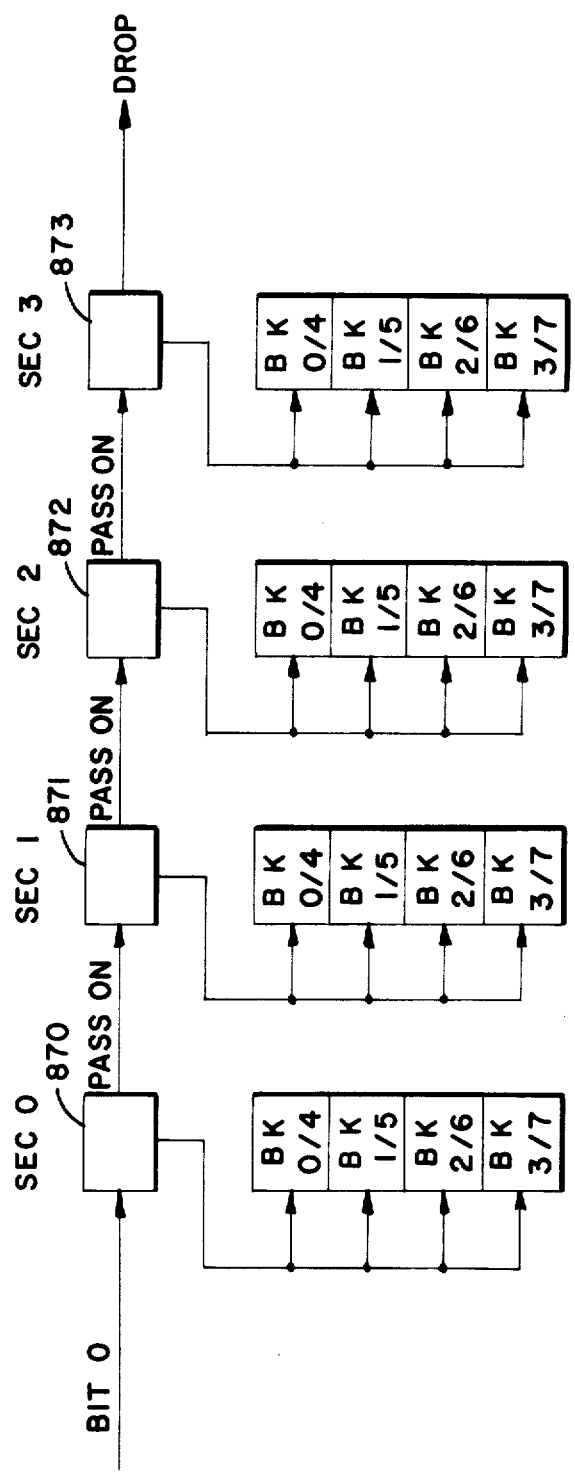
FIG. 16 is a functional block diagram of the write data word flow of the present memory system.
Figure 17:
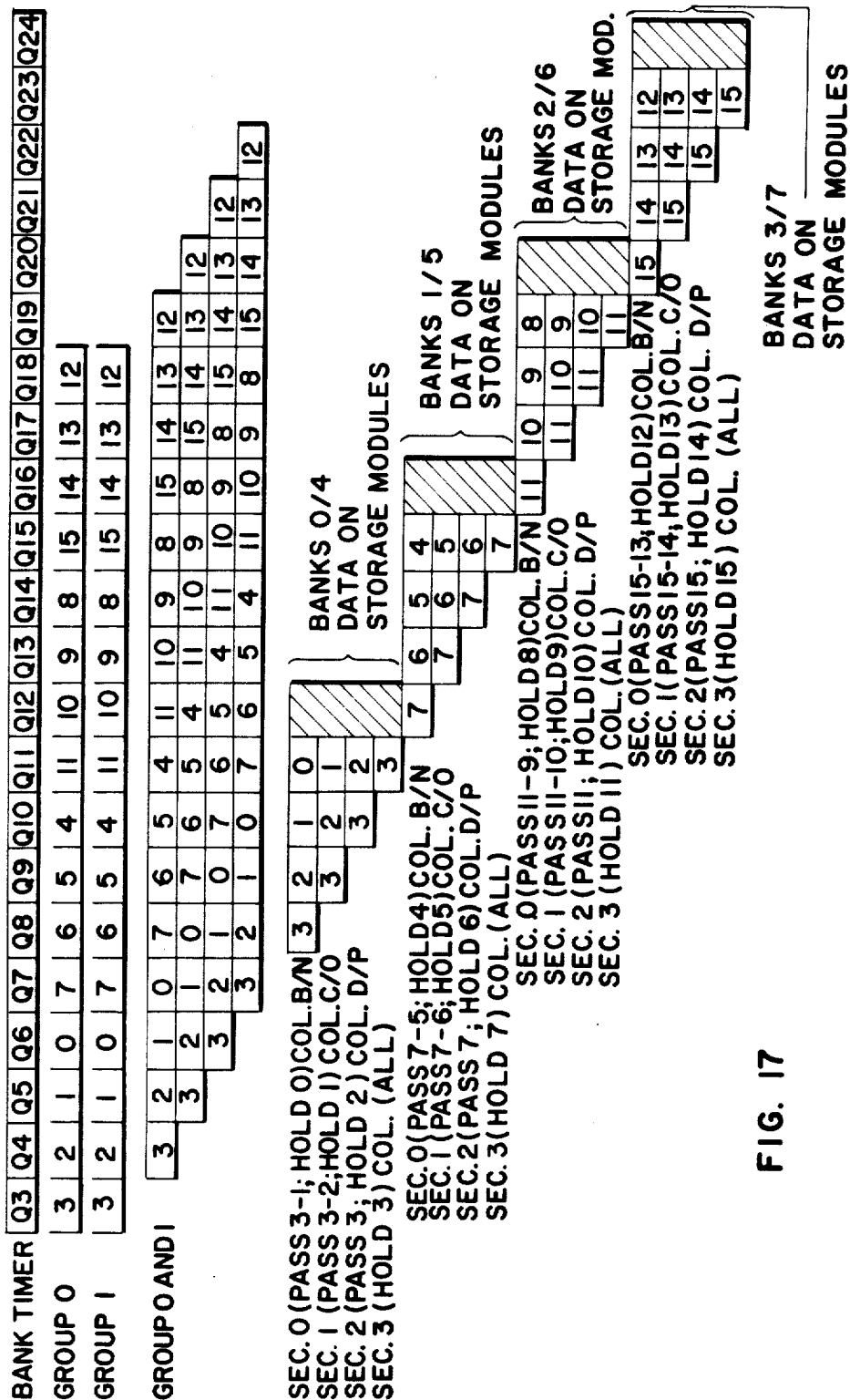
FIG. 17 is a functional timing diagram for the write word operation of the present memory system.

The distribution of one bit of the eight bits distributed to each module 850 is illustrated in FIG. 16. The illustration of FIG. 16 will be explained with reference to FIG. 17, which is a write data word flow and assembly functional timing diagram. In FIG. 17, the timing bar across the top of the chart shows a bank timer term, Q3–Q24, which synchronizes the distribution of words into the memory. The word numbering for this chart begins with the word 0 as the first word of the series written into each group, although in actuality Group 0 receives the first word of the write block, Group 1 gets the second, Group 0 gets the third, and so forth. But to keep the chart meaningful, it shows words 0–15 for each group. The chart shows where each word is located at each clock period. To simplify the chart for illustration, it is directed to the 4164 timing for the 150 ns version of the 4164 memory chip. In actual practice, delays are inserted at the appropriate place to accommodate the longer cycle time of the 200 ns chip. Groups 0 and 1 receive word 3 at Q3. The words then go through a four clock period delay in the group write error correction circuit 861, shown as each of the four rows offset by one clock period.

At Q8, bit 0 of word 3 arrives in a pass-on register 870 provided in the section 0 of a group. In all, there are 72 such registers provided in section 0, from which data is fanned out to the appropriate chip rows in the storage modules 850. The same is provided for the other sections. Each of these registers provides one bit of data to all corresponding chip groups as illustrated in FIGURE 13, i.e., 830, 838, etc. Section 0 passes bit 0 of words 3, 2 and 1 on each succeeding clock period Q9, Q10 and Q11 at which point it holds bit 0 of word 0. Thus, at Q11 the corresponding registers 870 of sections 0-3 (870-873) hold bit 0 of words 0-3 so that the corresponding memory chip in the 0 modules 850 may be simultaneously loaded.

At clock period Q12 bit 0 of word 7 arrives at the bank pair 1/5 in section 0 and is shifted on the next three clock periods into section 3 as sections 0-2 receive the sequential words 6, 5 and 4. Thus, at Q15 sections 0-3 hold the respective bit 0 of words 4-7 and these are loaded at this time. The same pattern is repeated over clock periods Q16 to Q23, so that by clock period Q24 a total of 32 words have been stored (including all bits). It may be observed that after each load cycle (i.e. Q11) the loaded data bits remain in the pass on registers. On each succeding cycle these bits are simply shifted over and dropped out of the section 3 register 873. Thus, all sections see every word of data at one point but only capture those words designated for it, as accomplished by the addressing circuits.

Figure 18:
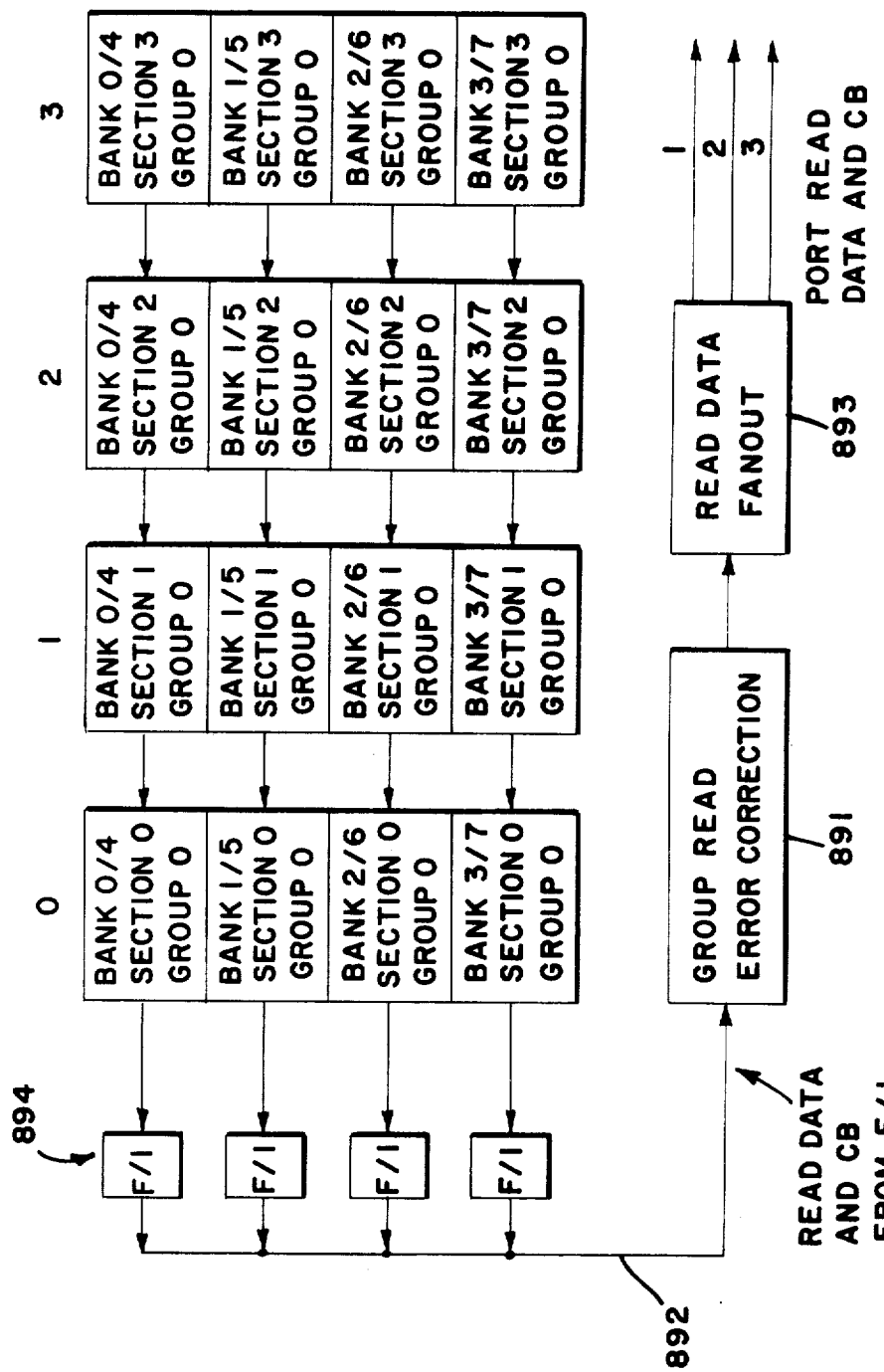
FIG. 18 illustrates the storage section read data path for one group of the present memory system.

FIG. 18 illustrates the storage section read data paths for one group. These perform similarly to, but in reverse of, the storage section write data paths illustrated in FIG. 15. A group read error correction circuit 891 is provided to receive a 72 bit word over a fan-in netword 892 from fan-in circuits 894, which may receive a word of data from any one of the section O's bank pairs. A read data fan-out circuit 893 is provided for fan-out to any one of the data ports 1, 2 or 3.

Figure 19:
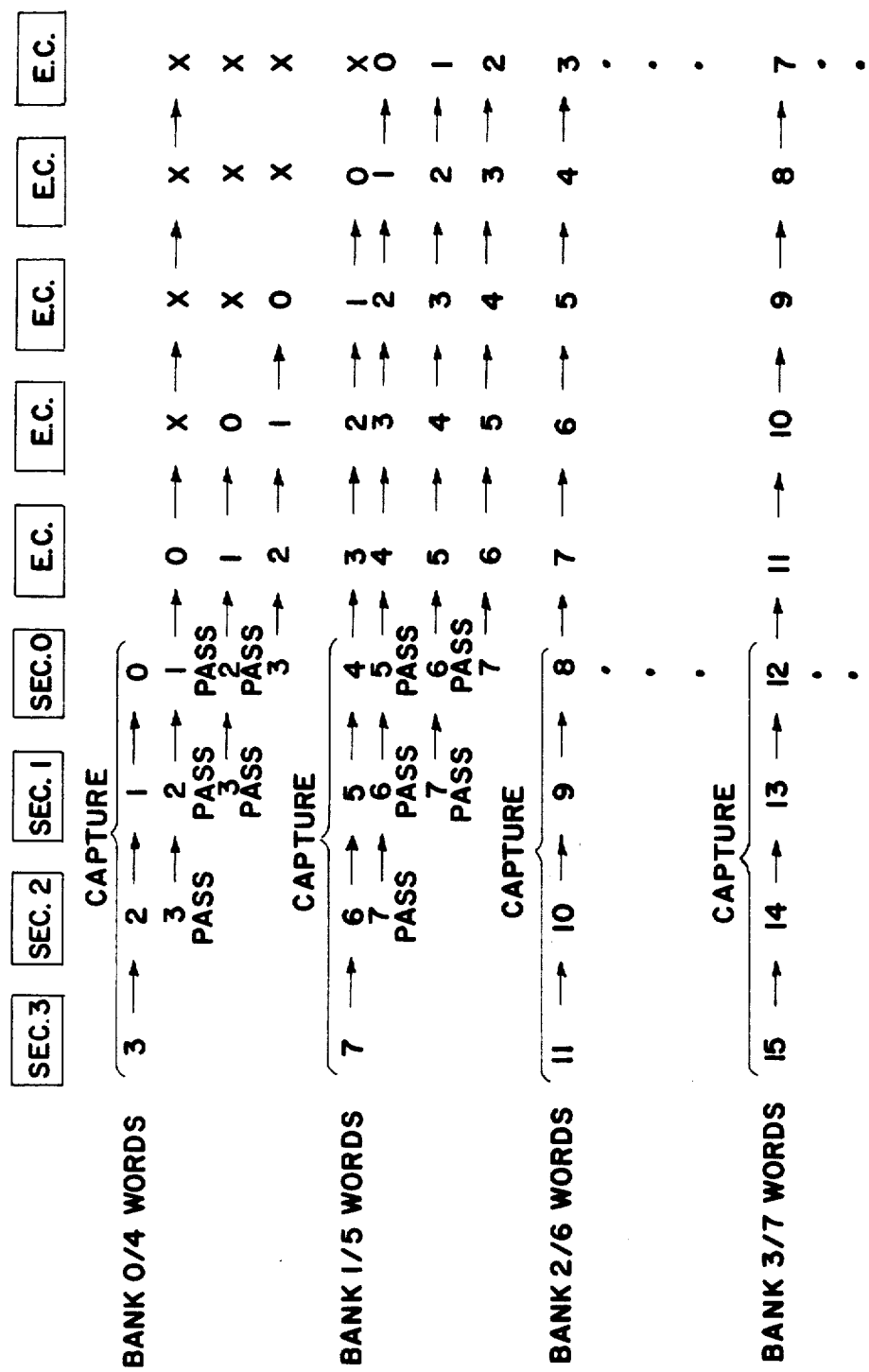
FIGS. 19 and 20 illustrate the read data word flow from storage of the present memory system.
Figure 20:
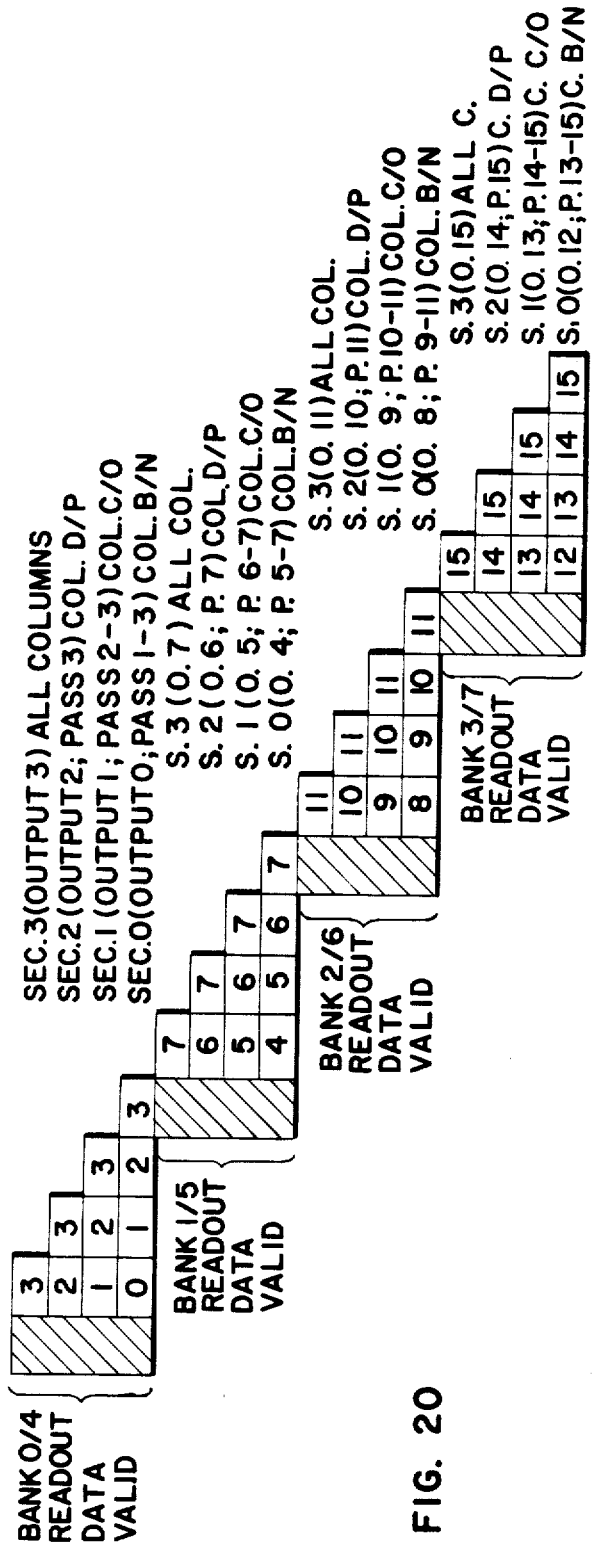

FIGS. 19 and 20 illustrate the read data word flow from storage, the timing in this case corresponding 2 the 200 ns memory chip version. On clock Q23 words 0-3 from all sections' banks 0 or 4, as the case may be, are captured or read out in a similar fashion to that for the case of a write operation as illustrated in FIG. 16. More particularly, an entire word is selectively gated or read out of corresponding address locations in corresponding banks into corresponding pass on registers. As in the case of the write operation, selective reading is provided for by the addressing circuits, with unselected chip data output pins presenting a high inpedence to the common data read bus. On clock period Q24 word 0 is passed from Section 0 through the fan-in circuits 894 to the error correction circuit 891 (designated E.C. in FIG. 19) and word 3 from Section 3 to Section 2, word 2 from Section 2 to Section 1 and word 1 from Section 1 to Section 0. At clock period Q27, word 3 is passed from Section 0 to the error correction circuit and words 7, 6, 5, and 4 are captured from each sections bank 1 or 5 as the case may be. After a four clock period delay in the error correction circuit, word 0 arrives for fan-out to a selected port at clock period Q28, as word 4 enters the error correction circuit from bank 1/5. This same pattern is repeated until all 16 words have been delivered to the fan-out circuit 893 at clock period Q43.

The control and generation of addressing for the present system will now be explained. As hereinbefore explained with reference to FIG. 13, each module 850 receives the storage cell row and column address (A0-A8) and is provided with chip select decode logic 851 which receives chip select addressing information over data bus 852 to generate the 16 RAS signals.

Figure 27:
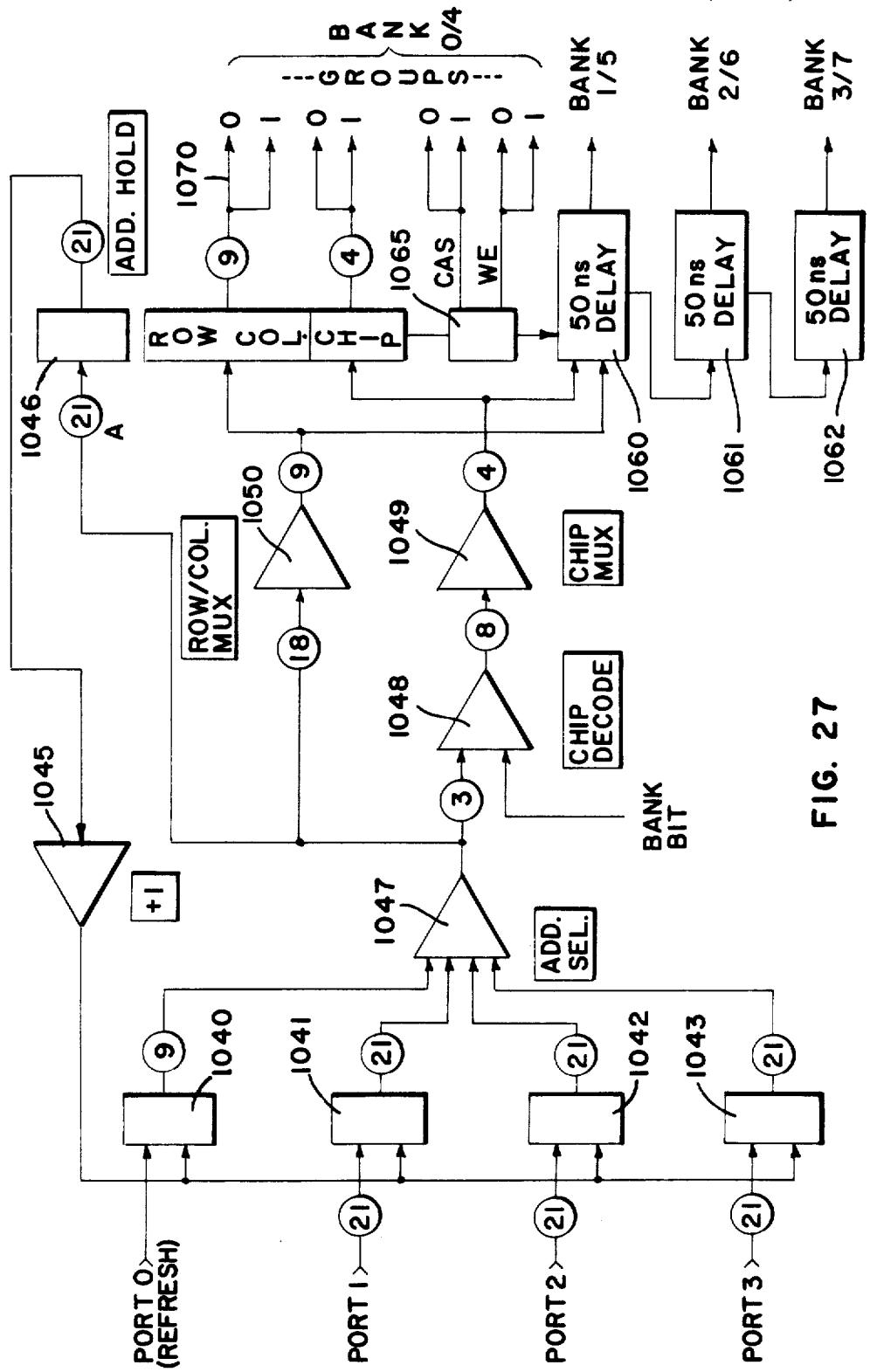
FIG. 27 is a functional block diagram of the address generation and control circuits of the present memory system.

Referring to FIG. 27, a functional block diagram of the circuits for generating and controlling distribution of the storage cell row and column addresses and the chip select signals for delivery to each module 850 may be seen. Registers 1040-1043 are provided to receive a starting address for a reference from the respective ports 0-3. Registers 1040-1043 may also be loaded with an address via an adder 1045, which receives a pending address reference from a holding register 1046. In operation, adder 1045 operates to increment the memory reference address during either refresh or reference operations after each group of words are read or written. A gate 1046 is provided to select the appropriate one of the addresses from registers 1040-1043 according to a priority scheme in which port 0 (i.e. refresh) has the highest priority.

An address provided through registers 1040-1043 includes 18 bits of storage cell row and column addressing information, 9 bits for each row and column specified and 3 bits of chips select information for specifying a particular row of chips in the storage modules 850 (i.e. rows 0-17 as shown in FIG. 13). A chip decode 1048 is provided to receive the 3 bits of chip select data and an upper or lower bank bit (i.e. either banks 0-4 or 5-7) and to provide at its output 8 bits of chip select information. The bank bit is toggled every 200 ns upon transition from banks 0-3 to 4-7 for reference operations. A chip select multiplexer 1049 is provided to receive the two 4 bit parcels and to multiplex them out in sequential clock periods to the decode logic 851 for an array module 850. Decode logic 851 includes a pair of registers for holding both 4 bit chip select parcels whereby these bits may be decoded.

The row and column addresses and chip selects from multiplexers 1050 and 1049 are sent to different modules 850 at 50ns intervals beginning with the modules for bank pair 0/4 and ending with the modules for bank pairs 3/7 150 ns later, as provided for by the delays 1060, 1061 and 1062, These addressing and chip select signals are fanned out 1 to 4 at the section level and 1 to 9 at the bank level, for example, bus 1070 is provided to all four sections in group 0 and fanned out in each section to all 9 modules 850 for bank pair 0/4.

In operation, the 50 ns delay between delivery of row and column and chip select information to the bank pairs corresponds to the number of clock periods needed to shift data four sections over. In the timing design of FIGS. 17 and 20 each bank timer Q term is one clock period, or 12.5 ns in the present system. Thus, data is captured for read or write once every 50 ns, i.e. four clock periods. Accordingly, the delivery of the row and column and chip select information to the bank pairs is synchronized with the data flow through the pass-on registers 870 so that the respective bank of each section is activated at the appropriate time to read or write data in response to the CAS and WE signals, which are provided separately for each bank pair from an addressing control circuit 1065. CAS and WE are fanned-out 1 to 4 at the section level and 1 to 9 at the bank level, like the row and column and chip select information. CAS and WE are synchronized with the delivery of the row and column and chip select information to the bank pairs so that the appropriate bank may be selectively activated at the correct time during a reference operation. Similarly, synchronized gating signals are provided to the pass-on registers 870 to gate data to and from a bank.

Figure 24:
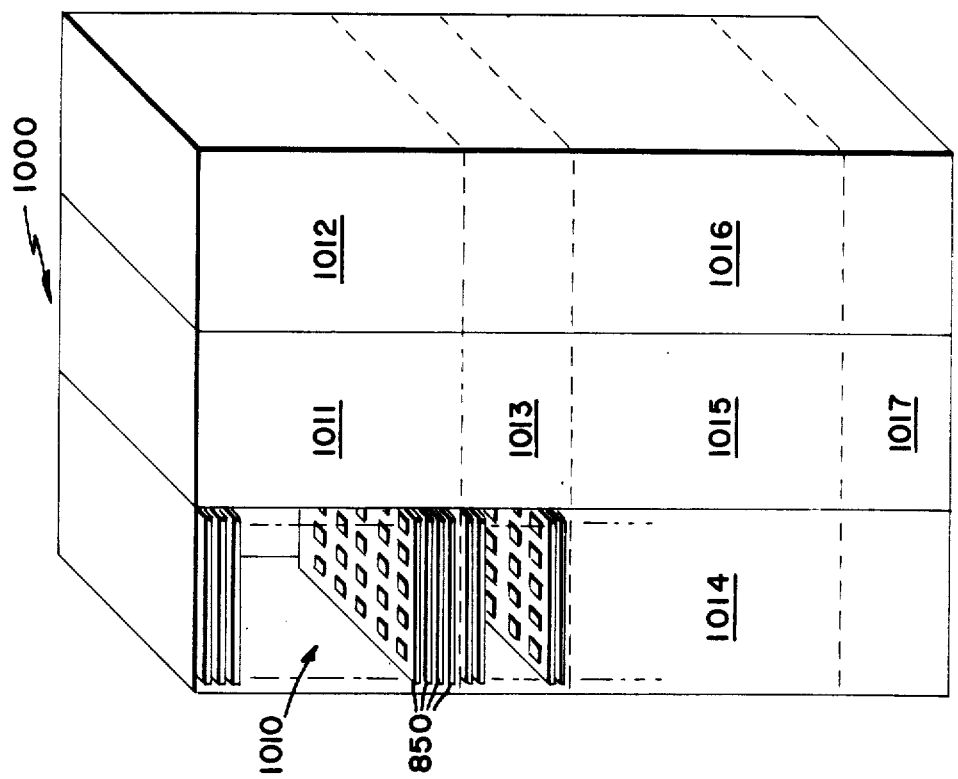
FIG. 24 is a perspective view of the chassis for the present memory system.
Figure 25:
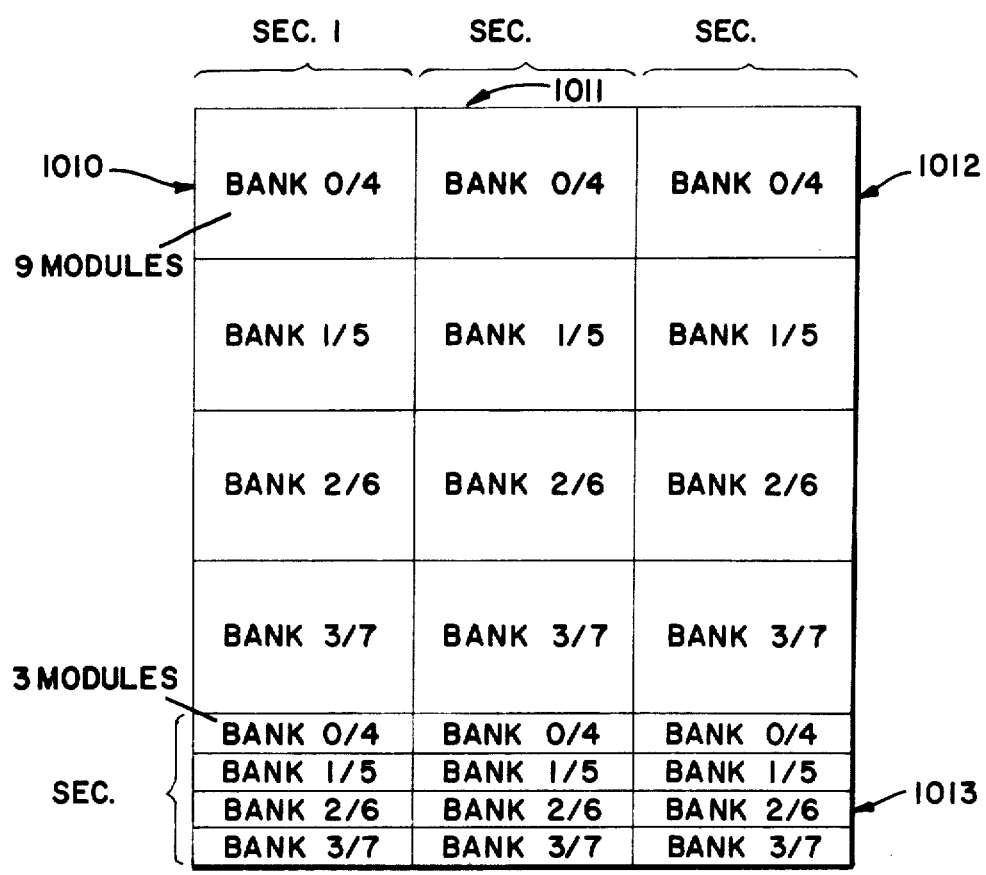
FIG. 25 is a bank pair location map for the present memory system.

As mentioned hereinbefore, and as may be seen more particularly with reference to FIG. 24, a three column chassis 1000 is provided to support modules 850 in a stacked relationship. Chassis 1000 may be thought of as partitioned into eight different sections 1010 through 1017 one housing each of memory sections (i.e. 0–3) as illustrated in FIG. 2. Sections 0–3 of group 1 housed in the respective chassis sections 1010–1013 and sections 0–3 of group 2 housed in the respective chassis sections 1014–1017. Each section houses 36 memory modules 850. In the case of sections 1010, 1011, 1012, 1014, 1015, 1016, the storage modules 850 are all oriented vertically of one another. For the case of section 1013 and 1017, the modules 850 are arranged in groups of twelve side by side in the three vertical columns for a total of thirty six modules. Referring to FIG. 25, the location of each group of nine modules 850 for each bank pair in the upper half (group 0) of chassis 1000 may be seen. As shown, the same bank pair modules for each section are positioned adjacent one another, horizontally for the case of section 0–2 and vertically for the case of section 3. The same is provided for group 1 in the lower half of chassis 1000. As may be easily seen, this positioning of modules in chassis 1000, along with the present systems "pipeline" data distribution technique reduces interconnection pin requirements, and simplifies data bus wiring as data paths may be simply jumped from section to section between bank pair modules.

Figure 26:
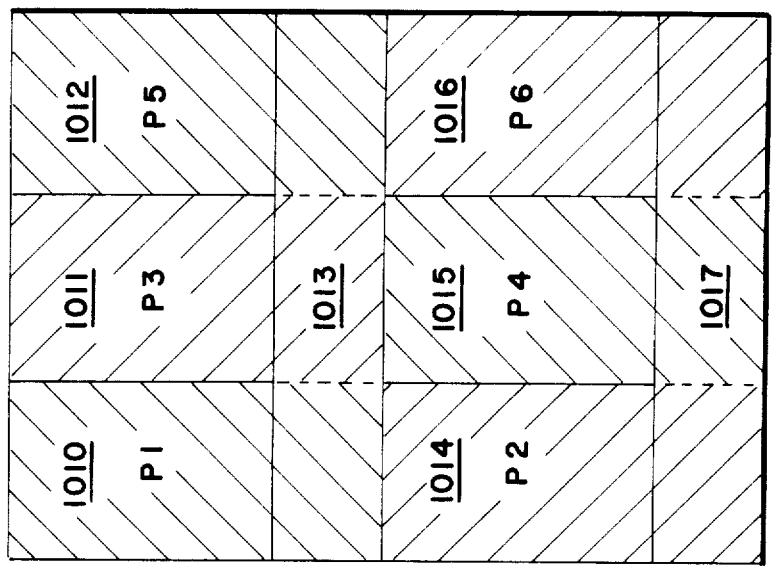
FIG. 26 is a power supply distribution map for the present memory system.

A total of six power supplies are provided to supply all of memory array chips on modules 850. Referring to FIG. 26, the distribution of the power supplies through the modules may be seen. A first power supply P1 supplies all the modules in section 1010 and the leftmost 12 modules 850 in section 1013, or in other words the top half of the leftmost column. A second power supply P2 supplies all modules in 1014 including the leftmost twelve of section 1017. A similar distribution for power supplies P3–P6 is provided. Physically, six power supply buses are provided with three of the buses, i.e. P1, P3 and P5 extending to the top of the chassis, the other three, i.e. P2, P4 and P6, extending to the top of sections 1014–1016.

During a memory refresh operation, the power supply distribution is critical to minimizing transients on the supply buses. As hereinbefore mentioned, refresh operation is assigned the name "port 0", and is handled internally by the memory control and addressing circuits. Port 0 always has priority over all other ports. Because refresh operations are overhead, it is essential that they are accomplished in a minimum of time. Therefore, it is an objective to refresh as many chips as possible at one time. However, since the refresh operation involves recharging the capacitive bit cells, current load increases dramatically above quiescent conditions, increasing system noise and causing transients on the supply busses. Thus, if too many chips are refreshed simultaneously from the same power supply bus bar, or if refresh operations are not sequenced or skewed sufficiently, supply voltage can be disturbed outside the operating limits of the chips, and data can be lost. The present system provides for a speedy and transient minimizing refresh operation through the above described power supply distribution and refresh sequence management.

Two rows of internal chip addresses (i.e. 512 storage cells) are refreshed every 6.4 $\mu$s on one half the total number of chips, during each operation. For the present 4164 memory chip, two rows may be selected for each operation by specifying only one row address. Thus, a total refreshing of the storage section 800 is accomplished in 256 refresh cycles, so that each chip is refreshed at least once every two milliseconds, as specified. An interval timer in the port 0 refresh control is provided to initiate a refresh operation every 6.4 $\mu$s. As hereinbefore mentioned, port 0 has the highest priority so that this vital operation may be unconditionally performed. In a single refresh operation, all bank 0's (both groups) are started in both groups, with the other banks 1–7 started sequentially at 50 ns intervals as provided for by the addressing and control circuits of FIG. 27. Sixty four chips (one side) on each module 850 are refreshed at a time (FIG. 13). Thus, refreshing is accomplished on a periodic basis to distribute power supply loading over time and within the chip vender supplied constraint of two milliseconds. Also, it will be seen that no power supply bus will be loaded with more than one sixth the total system power supply load, for both the static and dynamic case. Further, it will be observed that refresh operations may be accomplished using the same timing provided for reference operations, thus reducing circuit complexity.

As hereinbefore mentioned, port 1 is provided for maintenance and provides access for exercising the storage section 800 for preventative maintenance and fault isolation. The maintenance interface 802 is controlled by a maintenance computer 801 which provides a means of running diagnostic programs. In the preferred embodiment, the maintenance computer 801 is a TEI/Northstar 8-bit microcomputer. It is used for running diagnostics and for trouble shooting. More specifically, it can be used to check storage section addressing, data paths, and the error correction circuit, as well as the error log reporting. Further checking may be accomplished using the error log to verify the integrity of various data patterns, other address failures, large read and write operations and the refresh logic.

Figure 22:
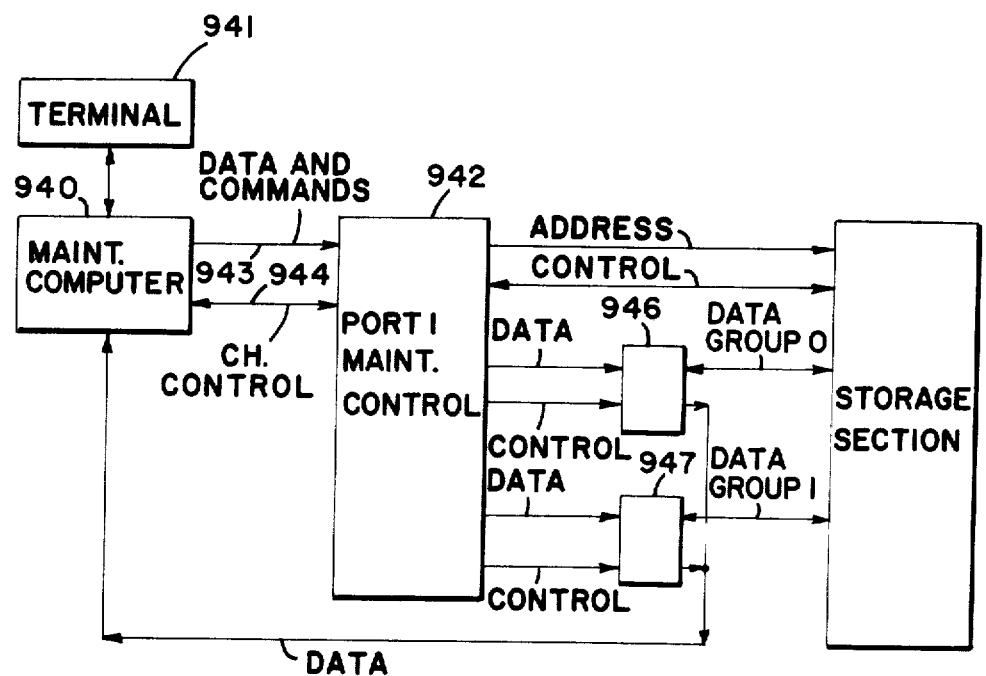
FIG. 22 is a block diagram of the maintenance interface of the present memory system.

FIG. 22 is a block diagram of the interface of the maintenance interface to a maintenance computer and the storage section 800 through port 1. A maintenance computer 940 interfaces with a terminal 941 through which the maintenance 940 is interfaced with a maintenance control 942 through a data and command channel 943 and a channel control line 944. Maintenance control 942 is connected to two memory group exercising circuits 946 and 947, for Group 0 and Group 1 respectively of the memory, through data and control lines. The memory group to be exercised is selected by the operator by commands, and the maintenance control circuit 942 selects the correct exercise circuit 946 or 947 for that group. Each of exercise circuits 946 and 947 contains a variety of data path options that are controlled by the maintenance control 942. The selected data goes to the storage section in a write operation and in a read operation data from the storage section passes through the appropriate exercise module and out to the maintenance computer. The storage section handles the maintenance port 1 in the same way it handles the other I/O ports. However, the maintenance control circuit 942 can send special combinations of control signals to the storage section for various diagnostic purposes. In addition, the maintenance interface is programmable to allow exercising the storage section in special maintenance modes. Thus, various parameters for tests and references may be specified.

Figure 23:
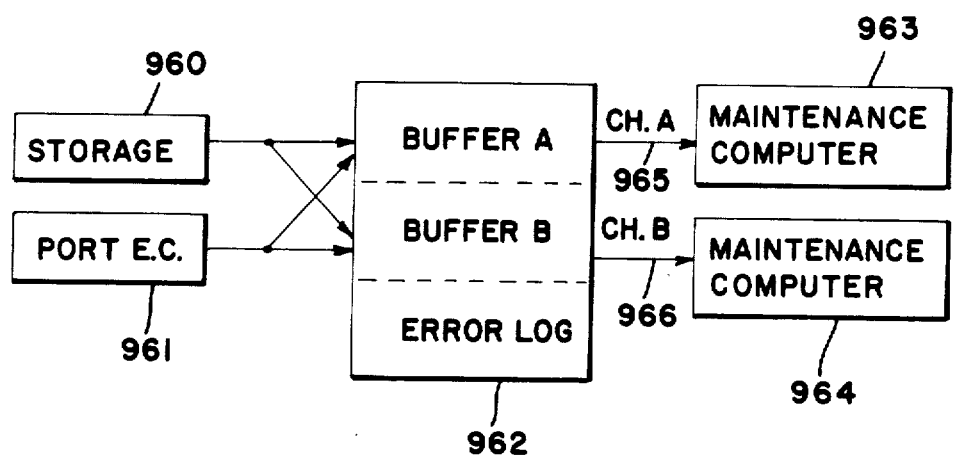
FIG. 23 is a functional block diagram of the error log capability of the present memory system.

A simple block diagram of the error log capability of the present memory is shown in FIG. 23. Two error detection and correction circuits 960 and 961 are provided for the storage section and ports respectively. (Refer to FIG. 1.) The error log 962 has two buffers A and B to store information about two errors. Each set of error information is sent to a maintenance computer 963 or 964 over two separate channels A and B designated 965 and 966 respectively. When both buffers are full any new error information from either source will be ignored and lost. Also, if only one maintenance computer is utilized, only one error may be recorded at a time. The first error information, from either one of the sources, goes into both empty buffers. If both maintenance computers 963 and 964 are connected and active, both receive the first error information. The second set of error information goes into the first empty buffer and out that channel. Each following set of error information passes through the same way, with each set moving into the first buffer that comes empty.

Figure 28:
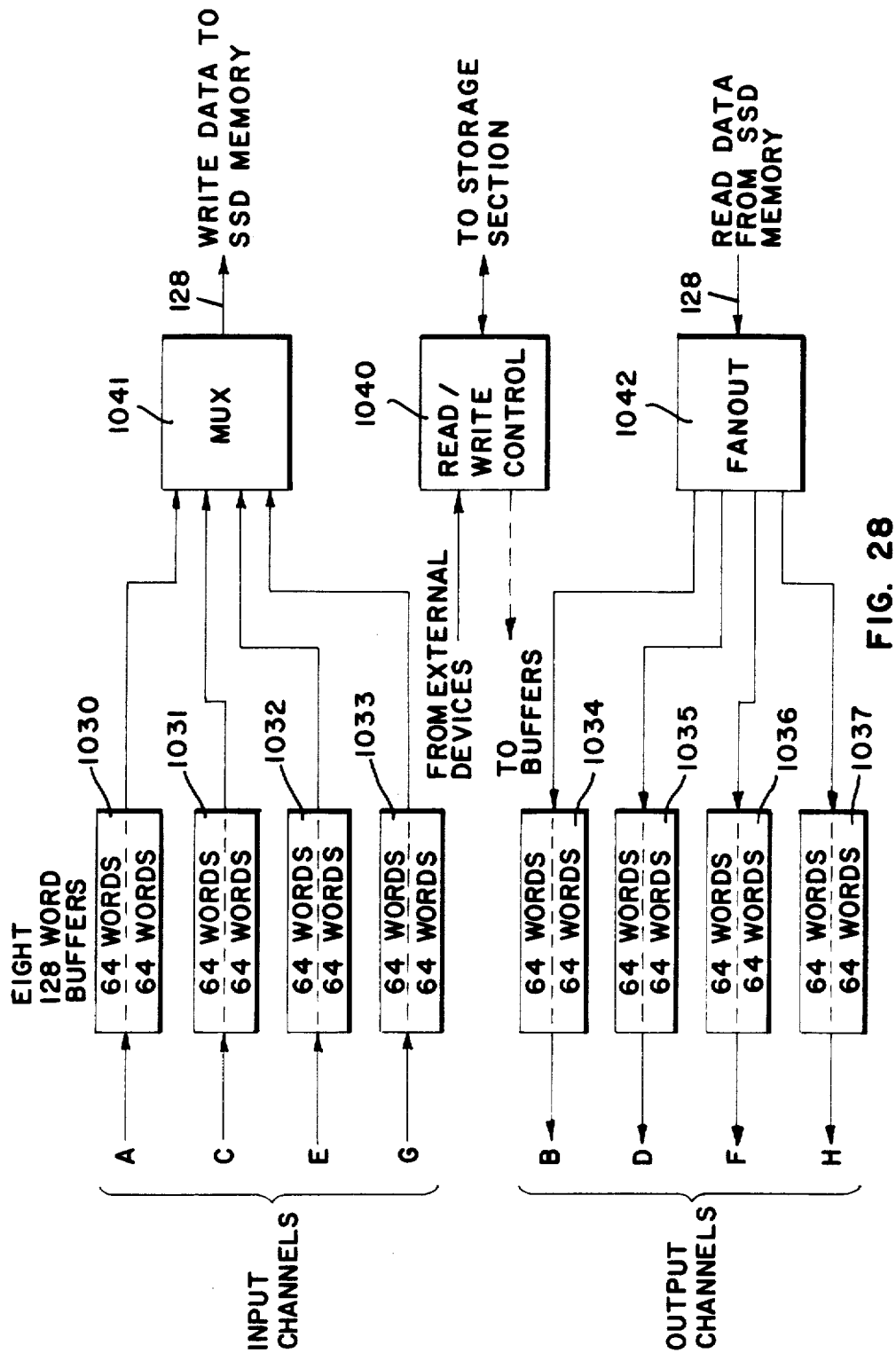
FIG. 28 is a functional block diagram of the high speed interface of the present memory system.

Referring to FIG. 28 there may be seen a functional block diagram of the high speed interface 804. Interface 804 provides a means for interfacing the storage section 800 through port 2 to external devices, for example a mainframe computer 805 or an I/O processor 807. Four channels A, C, E and G are provided to receive data from an external device and to multiplex it into the storage section 800 after buffering. Each channel may be connected to an external device whereby up to four external devices may be interfaced with the storage section. Similarly, four output channels B, D, F and H are provided to receive data from the storage section 800 and multiplex and buffer it to external devices. Typically, input and output channels are provided in pairs to an external device, for example A and B, C and D, E and F or G and H. Each of the buffers 1030–1037 is an 128 word circular buffer divided into two 64-word groups. Each are provided with control signals sections, from read/write control 1040, which communicates with external devices and the storage section 800. For example, addressing information and synchronization signals are passed from the external device to the storage section through control 1040.

During a write data operation to the storage section 800, an input buffer 1030–33 will receive 64 words of input data from an external device in 16 word blocks until 64 words have been received. After 64 words have been received the channel control sends a request to the storage section 800 and in particular the priority logic. When ready to receive, storage section 800 will cause 64 words from the ready buffer to be delivered to the storage section 800 through multiplexer 1041, two words at a time. As was explained with reference to FIG. 8, the rate at which the storage section 800 may transfer depends on the memory size, i.e. one, two or four sections, and it is at this point that the appropriate gaps in the pipeline data flow are provided as required for the one and two section configurations. Simultaneously with emptying the first 64 words the other half of the buffer may be filling. Of course, the words are reversed using the reversal technique hereinbefore described with reference to FIG. 12.

Read operations proceed in a similar but reverse fashion with buffers 1034-1037 filling up with 64 words at a time from a block read and being delivered to an external device over one of the perspective output channels B, D, F or H.

Figure 21:
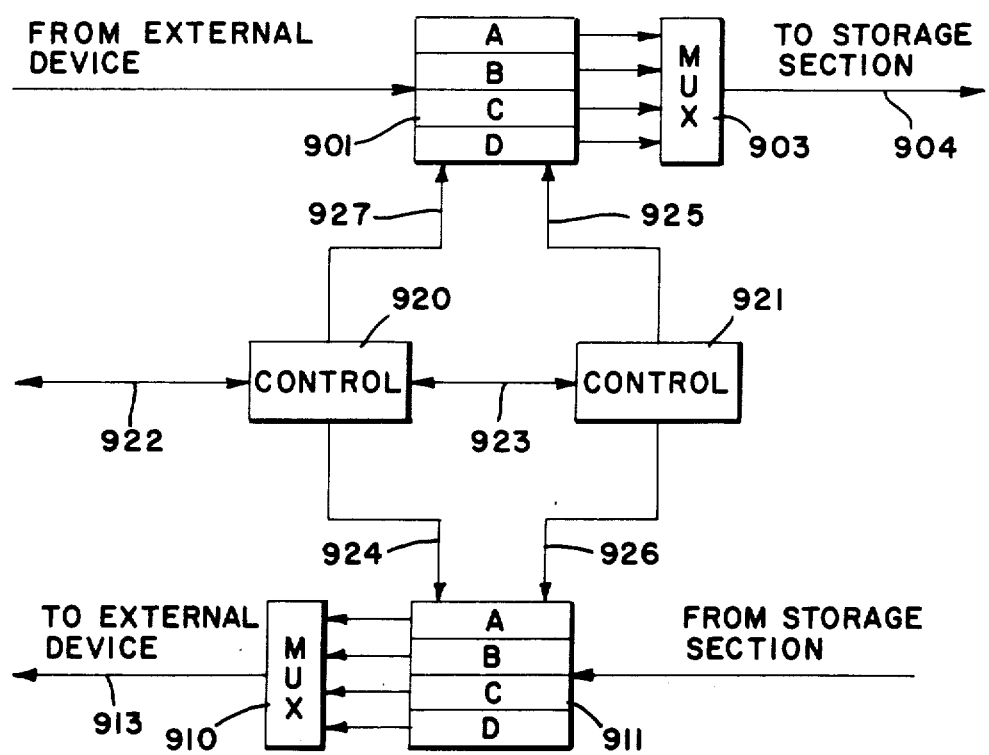
FIG. 21 is a functional block diagram of the very high speed interface of the present memory system.

As hereinbefore mentioned, port 3 is provided to support the full 1.25 gigabyte/s transfer rate capability of the present memory system. Referring to FIG. 21, four 16 × 144 buffers A through D 901 are provided to receive 144 parallel bits (two words) over an interface cable 902 from a data source, such as a mainframe computer. Buffers 901 are connected to a four to one multiplexor 903, which is 144 bits wide. Thus, words may be multiplexed from buffers 901 through multiplexor 903 and sent over a bus 904 to the storage section 800. A conversion from the external device's clock speed to the present memory system's clock speed is accomplished in buffers 901, with the input clock synchronized to the data source clock and the output clock synchronized to the clock of the present system.

A second group of buffers A-D 911 are provided to receive read data from the storage memory section 800 over 144 bit wide data path 912, and are clocked in the same manner as buffers 901 to convert from the memory clock speed to the destination device clock speed. A second four to one 144 bit wide multiplexor 910 is connected to the output of buffers 911 to selectively gate 144 bit wide words to a cable 913 for delivery to the destination device.

Read and write control circuits 920 and 921 are provided to control the reading and writing of data between the present memory system and the external source or destination device. Read and write control 920 is synchronized with the external device and receives control signals over a line 922 from the external device's control. Read and write control 921 is synchronized with the present system's clock and communicates with read and write control 920 over a control line 923. Each of read and write controls 920 and 921 are provided with respective read control line 924 and 925 and write control lines 926 and 927 for connection to the respective buffers 911 and 901. The 144 bit wide channels 902, 904, 912 and 913 carry 128 bits of data (two words) and 16 bits of check bit information (one per word). Thus, two sixty-four bit words and 16 check bits may be passed between the multiprocessor and the storage section 800 on each clock cycle.

All transfers between the external device and the present memory system are accomplished in 32 144 bit wide word blocks. The starting address provided by the controlling processor determines the address of the first word of a block, and the rest of the addressing is provided by the internal addressing control circuits, as shown in FIG. 27.

During a write operation, data is read from the external device's memory into its own transfer buffers. As soon as its buffers are full, the external device's control looks to see if there is a buffer A-D available in the interface. When a buffer is available, the data is sent in 16 clock periods, two 72 bit words per clock period. When one of buffers 901 fills, a reference is made for it to write to the storage section 800. The data is written to the storage section 800 through port 3, two words every clock period, whenever the storage section 800 can accept two words (as affected by the size and configuration of the memory). Of course, buffers 901 may be addressed to reverse word order as required, as for example shown with respect to FIG. 12. After the last buffer from the external device has been transferred, an interrupt is generated to the external device.

For write operation, the control 921 to see if any of the four buffers 911 are empty, and if so, a reference is made to read the storage section 800. The data is then written to a buffer, two words per clock period and a full flag is set for that buffer. If any of buffers 921 is full and if there is an empty buffer in the destination device, the data is sent to the destination device buffer at a rate of two words per clock period. This operation continues until the reference is completed.

Although the present invention has been described herein in its preferred form, those skilled in the art will readily appreciate that various modifications may be made thereto without departing from the spirit and scope of the invention as set forth in the claims appended hereto.

What is claimed is:

1. A high capacity, high bandwidth solid state storage system comprising:
    a plurlity of storage sections each including RAM organized into a plurality of addressable memory locations for storing data, said system configured to include up to a maximum of s storage sections, where s is an integer greater than one;
    each of said storage sections including addressing means for referencing said memory locations in said RAM so that data may be read or written simultaneously in each of said sections;
    each of said sections including a pipeline input register for holding a word of data to be stored in the section, each of said input pipeline registers connected to said RAM so that when said RAM is referenced by said addressing means the respective words of data in said input registers are written into the respective sections in the referenced memory locations simultanuously;
    means for connecting all of said input registers to provide a one-word wide data input pipeline between said storage sections, said data input pipeline having an input for receiving words to be stored in said sections;
    input port means for receiving data words from an input data bus and supplying said data words to said input of said data input pipeline in synchrony with a first high bandwidth clock signal; and
    write control means connected to said input pipeline registers for,
    (a) causing said input registers to synchronously pass data words from one to another along said data input pipeline from section to section away from said input port means at the rate of said first clock signal;
    (b) causing said addressing means to reference said RAM every n clock periods of said first clock signal, where n is an integer equal to the maximum number s of said storage sections in a fully configured system, so that the data words in said input registers during said reference are captured and written into said storage sections, each of the individual storage sections storing the data word held in its corresponding input register whereby up to s words of data may be stored every n clock periods of said first clock signal; and
    (c) causing said input port means to supply w words every n clock periods of said first clock signal, where w is an integer equal to the number of sections configured in said system, said w words supplied so that they are captured simultaneously in said sections during said reference;
    each of said sections including a pipeline output register, each of said output registers for holding a data word and connected to said RAM so that when said RAM is referenced by said addressing means the words in the referenced memory locations are transferred into the respective output registers;
    means for connecting all of said output registers to provide a one-word wide data output pipeline between said storage sections, said data output pipeline having an output for outputting words retrieved from said sections;
    output port means for receiving data words from said data output pipeline and conveying the received words to an output data bus in synchrony with a second high bandwidth clock signal;
    read control means connected to said output registers for,
    (a) causing said output registers to synchronously pass data words from one to another along said data output pipeline from section to section towards said output port means at the rate of said second clock signal;
    (b) causing said addressing means to reference said RAM every n clock periods of said second clock signal so that data is captured in said output registers simultaneously from said storage sections during said reference, each of the individual storage sections providing a data word to its corresponding output register whereby up to s words of data may be read every n clock periods of said second clock signal; and
    said output port means conveying w words to said output data bus every n periods of said second clock signal.

2. The storage system according to claim 1 wherein the RAM and pipeline register in each of said storage sections are physically supported on a plurality of circuit board modules which are each supported in proximity to one another in a system chassis, each of said modules supporting a portion of the total RAM in each section, and wherein storage sections which have connected pipeline registers are positioned physically adjacent one another to minimize the distance between adjacent ones of said pipeline registers, and further wherein said means for connecting input registers and means for connecting output registers each include a plurality of conductors which are jumpered between adjacent pipeline registers.

3. The solid state storage system according to claim 1 wherein said RAM in each section is organized into a plurality of storage banks.

4. The storage system according to claim 3 wherein the banks of each section are paired and wherein each pair of banks share a single addressing network from said addressing means, and further wherein only one bank of each pair is referenced at a time.

5. The storage system according to claim 4 wherein said RAM comprises a plurality of memory chips having a matrix of individual one-bit storage locations which are addressable by row and column and wherein each word stored in said banks is stored in a plurality of chips, one bit per chip, with the same row and column storage location utilized in each chip.

6. The storage system according to claim 4 wherein said addressing means simultaneously sends the same address to the corresponding banks in each of said sections every s clock periods of said first and second clock signals in write and read operations respectively, so that words read or written on the same clock period are stored in corresponding memory locations.

7. The storage system according to claim 6 wherein said same addressing means sends the address to the corresponding banks in each section until each bank has stored one word in the location of said address, said address being sent to a different set of corresponding banks every s clock periods of said first and second clock signals during write and read operations, respectively.

8. The storage system according to claim 7 wherein said addressing means generates one new address every s clock periods of said first and second clock signals in write and read operations respectively, and wherein said addressing means includes means for delaying said address s clock periods of the respective clock signals and consequently conveying it to the next consecutive set of banks.

9. The storage system according to claim 5 wherein said RAM is dynamic and further including refresh means for periodically refreshing all said memory chips through said addressing means and addressing network, said refresh means causing said addressing means to reference one or more rows of internal chip addresses for refresh at a time, said refresh addresses delivered to the corresponding banks in each section with a different bank referenced every s clock periods of said first clock signal.

10. The storage system according to claim 9 further including a plurality of power supplies for supplying power to said RAM, the power requirement of said RAM distributed over said supplies to minimize worst case load on said supplies so that refresh noise spikes are minimized.

* * * * *